(12) United States Patent
Aikawa

(10) Patent No.: US 11,815,561 B2
(45) Date of Patent: Nov. 14, 2023

(54) AC-AC CONVERTER WITH OPEN PHASE DETECTION BASED ON SECOND HARMONIC

(71) Applicant: TOSHIBA MITSUBISHI-ELECTRIC INDUSTRIAL SYSTEMS CORPORATION, Chuo-ku (JP)

(72) Inventor: Kyota Aikawa, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 303 days.

(21) Appl. No.: 17/287,051

(22) PCT Filed: Jul. 26, 2019

(86) PCT No.: PCT/JP2019/029418
§ 371 (c)(1),
(2) Date: Apr. 20, 2021

(87) PCT Pub. No.: WO2021/019601
PCT Pub. Date: Feb. 4, 2021

(65) Prior Publication Data
US 2021/0367528 A1 Nov. 25, 2021

(51) Int. Cl.
*G01R 31/54* (2020.01)
*G01R 19/165* (2006.01)
*G01R 23/06* (2006.01)

(52) U.S. Cl.
CPC ........... *G01R 31/54* (2020.01); *G01R 19/165* (2013.01); *G01R 23/06* (2013.01)

(58) Field of Classification Search
CPC .................................................. H02P 29/0243
See application file for complete search history.

(56) References Cited

U.S. PATENT DOCUMENTS

| 5,903,116 A | * | 5/1999 | Geis | H02P 9/04 318/140 |
| 2008/0143285 A1 | * | 6/2008 | Lucas | H02M 1/44 318/400.24 |

FOREIGN PATENT DOCUMENTS

| JP | 10-62470 A | 3/1998 |
| JP | 2010-187521 A | 8/2010 |

(Continued)

OTHER PUBLICATIONS

Indian Office Action dated Sep. 21, 2022 in Indian Patent Application No. 202017029788, 5 pages.

(Continued)

*Primary Examiner* — Peter M Novak
(74) *Attorney, Agent, or Firm* — Oblon, McClelland, Maier & Neustadt, L.L.P.

(57) ABSTRACT

A power conversion device of an embodiment includes a rectifier that full-wave rectifies alternating current of a plurality of phases supplied from a power supply side, a capacitor that smoothes an output voltage of the rectifier, a voltage detection unit that detects the smoothed voltage, and an open phase detection unit that detects that an open phase has occurred in the alternating current of the plurality of phases based on a component having a frequency that is twice as high as a fundamental frequency of the alternating current of the plurality of phases included in frequency components of the smoothed voltage.

11 Claims, 17 Drawing Sheets

(56) References Cited

FOREIGN PATENT DOCUMENTS

| JP | 2013-74789 A | 4/2013 |
|----|--------------|--------|
| WO | WO 2011/023137 A1 | 3/2011 |

OTHER PUBLICATIONS

International Search Report dated Sep. 3, 2019 in PCT/JP2019/029418 filed on Jul. 26, 2019, 2 pages.

* cited by examiner

AC-AC CONVERTER WITH OPEN PHASE DETECTION BASED ON SECOND HARMONIC

TECHNICAL FIELD

Embodiments of the present invention relate to a power conversion device and an open phase detection device.

BACKGROUND ART

There has been known an open phase detection device that detects an open phase (broken phase) occurring on a secondary side of a transformer based on a voltage on an AC input side. It is desired to detect the open phase based on a voltage between terminals of a capacitor, which is detected by a voltage detector.

CITATION LIST

Patent Literature

[Patent Literature 1]
Japanese Unexamined Patent Application, First Publication No. 2010-187521

SUMMARY OF INVENTION

Technical Problem

An object of the present invention is to provide an open phase detection device capable of detecting an open phase based on a voltage between terminals of a capacitor, which is detected by a voltage detector.

Solution to Problem

A power conversion device according to the present invention includes a rectifier, a capacitor, a voltage detection unit, and an open phase detection unit. The rectifier full-wave rectifies alternating current of a plurality of phases supplied from a power supply side. The capacitor smoothes an output voltage of the rectifier. The voltage detection unit detects the smoothed voltage. The open phase detection unit detects that an open phase has occurred in the alternating current of the plurality of phases based on a component having a frequency that is twice as high as a fundamental frequency of the alternating current of the plurality of phases included in frequency components of the smoothed voltage.

DESCRIPTION OF EMBODIMENTS

Figure 1:
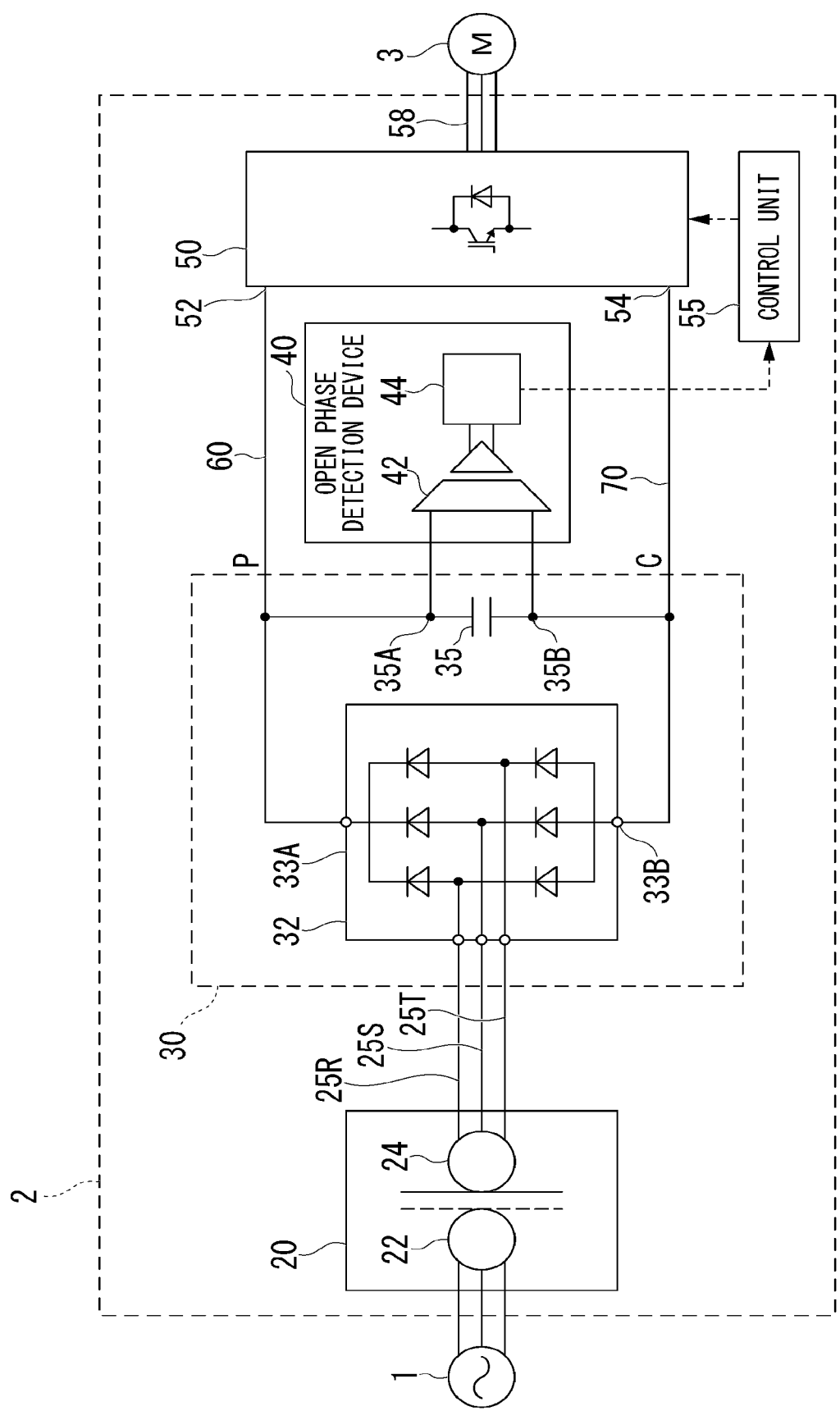
FIG. 1 is a configuration diagram of a power conversion system of a first embodiment.

Hereinafter, an open phase detection device and an open phase detection method of a power conversion device of embodiments will be described with reference to the drawings. In the following description, elements having the same or similar functions are denoted by the same reference numerals.

The term "connection" in the specification is not limited to a case where connection is made physically and also includes a case where connection is made electrically.

In the present specification, an open phase means that power of a phase is not supplied due to disconnection of windings of electric wires or a transformer, connection failure, melting of a fuse, open circuit, and the like.

In the present specification, a frequency of a fundamental wave in the waveform of three-phase AC power is referred to as a fundamental frequency.

First Embodiment

FIG. 1 is a configuration diagram of a power conversion system 2 of a first embodiment. FIG. 1 illustrates an AC power supply 1, the power conversion system 2, and an electric motor 3.

The AC power supply 1 is a commercial power supply, a power generator and the like, and supplies three-phase AC power to the power conversion system 2.

The electric motor 3 is, for example, an AC variable speed electric motor such as an induction motor. The electric motor 3 is driven by AC power supplied from the power conversion system 2 and outputs rotational driving force to an output shaft (not illustrated).

The power conversion system 2 includes, for example, a transformer 20, a rectifier 32, a capacitor 35, an open phase detection device 40, an inverse conversion device 50, and a control unit 55. The power conversion system 2 forward-converts the three-phase AC power, which is supplied from the AC power supply 1, by using the rectifier 32 and the capacitor 35 to generate DC power, inversely converts the DC power by using the inverse conversion device 50 to generate three-phase AC power, and supplies the three-phase AC power to the electric motor 3.

The transformer 20 is, for example, a three-phase transformer. The transformer 20 includes, for example, a primary winding 22 and a secondary winding 24. The transformer 20 receives the supply of the three-phase AC power from the AC power supply 1 through the primary winding 22, transforms the received three-phase AC power, and outputs the transformed three-phase AC power from the secondary winding 24. One end of each of transformer output lines 25R, 25S, and 25T is connected to each of the R, S, and T phases of the secondary winding 24. The other ends of the transformer output lines 25R, 25S, and 25T are connected to AC input terminals of the rectifier 32. The three-phase AC power output from the secondary winding 24 is output to the rectifier 32 via the transformer output lines 25R, 25S, and 25T. The secondary winding 24 and the transformer output lines 25R, 25S, and 25T are a part of an object whose open phase is detected by the open phase detection device 40.

The rectifier 32 includes, for example, an AC input terminal, a three-phase full-bridge diode rectifier circuit, a rectifier positive electrode terminal 33A, and a rectifier negative electrode terminal 33B. The rectifier 32 full-wave rectifies the three-phase AC power, which is supplied to the AC input terminal of the rectifier 32 from the transformer 20, by the three-phase full-bridge diode rectifier circuit, and outputs the rectified DC power from the rectifier positive electrode terminal 33A and the rectifier negative electrode terminal 33B.

The rectifier positive electrode terminal 33A is connected to one end of a positive electrode line 60. The other end of the positive electrode line 60 is connected to a positive electrode input terminal 52 of the inverse conversion device 50. The rectifier negative electrode terminal 33B is connected to one end of a negative electrode line 70. The other end of the negative electrode line 70 is connected to a negative electrode input terminal 54 of the inverse conversion device 50.

The capacitor 35 is connected between the positive electrode line 60 and the negative electrode line 70 and smoothes the DC power that is output from the rectifier 32. For example, the rectifier 32 and the capacitor 35 form a forward conversion device 30. The forward conversion device 30 is an example of a power conversion device.

The open phase detection device 40 includes, for example, a voltage detector 42 and an open phase detection unit 44.

The voltage detector 42, for example, detects a voltage applied between a positive electrode terminal 35A and a negative electrode terminal 35B of the capacitor 35 (hereinafter, referred to an inter-terminal voltage), and outputs a detection value representing the inter-terminal voltage to the open phase detection unit 44. The voltage detector 42, for example, detects the inter-terminal voltage via a DC voltage converter and the like whose input and output are insulated, quantizes the inter-terminal voltage by an analog-to-digital (AD) converter (not illustrated), and outputs the quantized voltage as a voltage detection value representing the inter-terminal voltage. The voltage detector 42 is an example of a voltage detection unit.

The open phase detection unit 44 acquires the voltage detection value representing the inter-terminal voltage from the voltage detector 42 and determines, based on the acquired voltage detection value, whether an open phase has occurred in an open phase detection target range. The open phase detection unit 44 and the open phase detection target range detected by the open phase detection unit 44 will be described below.

The inverse conversion device 50 is, for example, a two-level inverter including a switching element such as an insulated gate bipolar transistor (IGBT). The switching element of the inverse conversion device 50 is pulse width modulation (PWM)-controlled by the control unit 55. The inverse conversion device 50 converts the DC power, which is supplied from the rectifier 32 via the positive electrode line 60 and the negative electrode line 70, into three-phase AC power having a variable frequency and a variable voltage. The inverse conversion device 50 supplies the converted three-phase AC power to the electric motor 3 via a load power line 58.

The control unit 55 outputs a gate pulse signal to the switching element of the inverse conversion device 50 by feedback control based on a detection value and the like of a current detector (not illustrated) that detects a load current flowing through the load power line 58, thereby PWM-controlling the switching element. Moreover, the control unit 55 receives an open phase detection signal that is output in an open phase determination process by the open phase detection unit 44, which will be described below, and changes the control state of the PWM control based on the received open phase detection signal.

Next, the configuration of the open phase detection unit 44 and the content of the open phase determination process will be described. In the open phase determination process, the open phase detection unit 44 determines whether an open phase has occurred in the open phase detection target range, based on a component having a frequency that is twice as high as the fundamental frequency of the three-phase AC power supplied by the AC power supply 1, which is included in frequency components of a voltage smoothed by the capacitor 35. The open phase detection target range will be described below.

Figure 2:
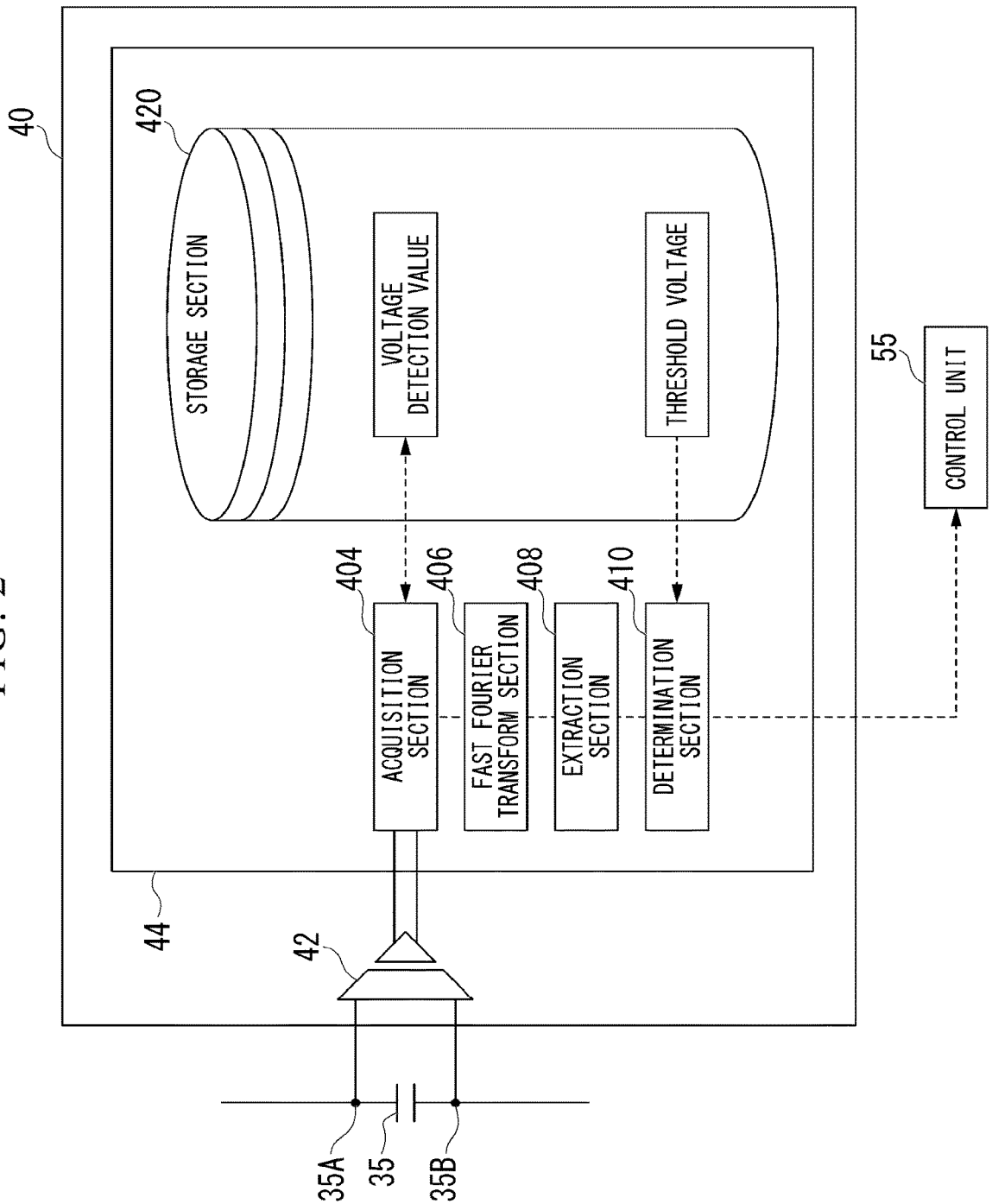
FIG. 2 is a configuration diagram of an open phase detection device of the first embodiment.

FIG. 2 is a configuration diagram of the open phase detection device 40 of the first embodiment. As described above, the open phase detection device 40 includes, for example, the voltage detector 42 and the open phase detection unit 44.

The open phase detection unit 44 includes, for example, an acquisition section 404, a fast Fourier transform section 406, an extraction section 408, a determination section 410, and a storage section 420. The storage section 420 stores, for example, the voltage detection value acquired by the acquisition section 404 and representing the inter-terminal voltage, a frequency spectrum generated by the fast Fourier transform section 406, an extracted frequency component $F_{ext}$, a threshold voltage $V_{TH}$, a program for the open phase determination process, and the like. Each of the acquisition section 404, the fast Fourier transform section 406, the extraction section 408, and the determination section 410 is implemented by, for example, a hardware processor such as a central processing unit (CPU) executing a program (software). Furthermore, some or all of these constituent elements may be implemented by hardware (circuit section; including a circuitry) such as a large scale integration (LSI), an application specific integrated circuit (ASIC), a field-programmable gate array (FPGA), and a graphics processing unit (GPU), or may be implemented by cooperation of software and hardware. The storage section 420 is implemented by, for example, a hard disk drive (HDD), a flash memory, an electrically erasable programmable read only memory (EEPROM), a read only memory (ROM), a random access memory (RAM) and the like.

The acquisition section 404 acquires the detection value (voltage detection value) detected by the voltage detector 42 and representing the inter-terminal voltage, and stores the detection value in the storage section 420. Furthermore, the acquisition section 404 acquires a detection value stored in the storage section 420 and representing a predetermined number of inter-terminal voltages and outputs the detection value to the fast Fourier transform section 406. Note that the acquisition section 404 may perform the acquisition of the detection value from the voltage detector 42 and the reading of the detection value from the storage section 420 in parallel.

Figure 6A:
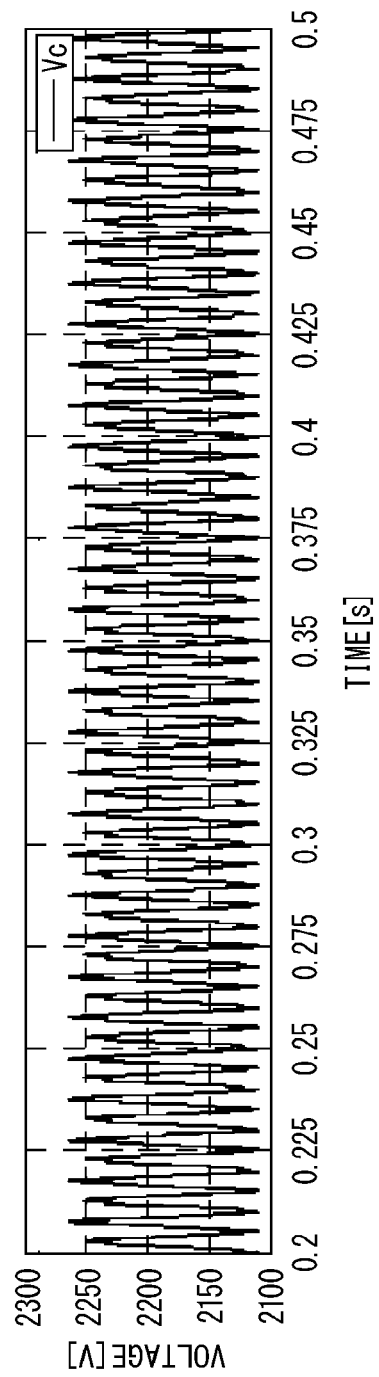
FIG. 6A is a diagram illustrating a simulation result of an inter-terminal voltage by an open phase detection device of the second embodiment when there is no open phase.
Figure 6B:
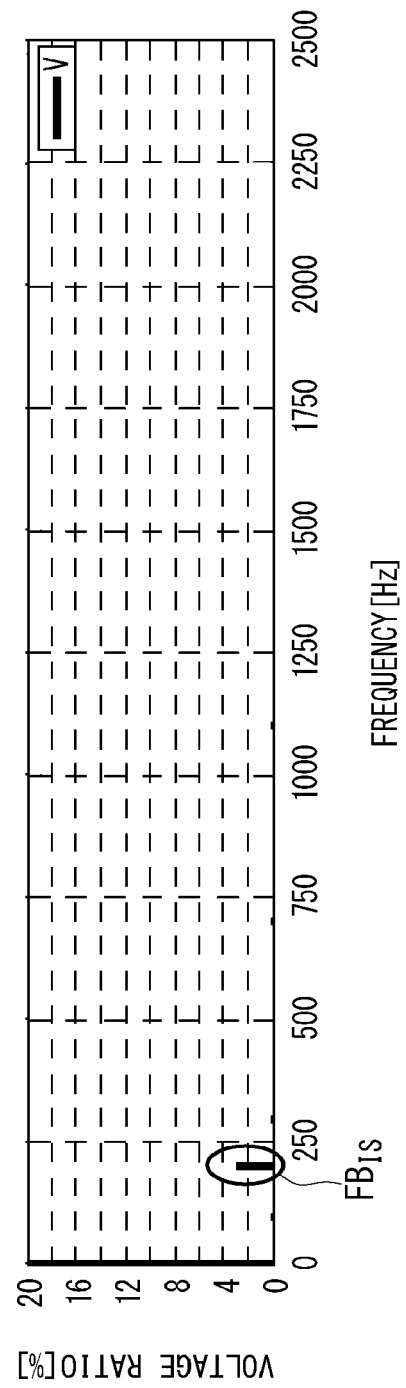
FIG. 6B is a diagram illustrating a simulation result of a frequency spectrum by the open phase detection device of the second embodiment when there is no open phase.

The fast Fourier transform section 406 generates the frequency spectrum by performing FFT processing (fast Fourier transform) on the voltage value representing the predetermined number of inter-terminal voltages, which is received from the acquisition section 404, and stores the generated frequency spectrum in the storage section 420. The frequency spectrum obtained by the FFT processing indicates frequency components of the predetermined number of inter-terminal voltages received from the acquisition section 404. The number of inter-terminal voltages, which are received in the fast Fourier transform section 406 from the acquisition section 404 for the FFT processing, can be set to any number such that frequency components desired to be extracted are included with sufficient resolution in the frequency spectrum obtained by the FFT processing. As an example, in order to obtain frequency spectrums illustrated in FIG. 6B and FIG. 6D to be described below, the fast Fourier transform section 406 acquires data of inter-terminal voltages as illustrated in FIG. 6A and FIG. 6B.

The extraction section 408 extracts a component having a frequency that is twice as high as the fundamental frequency of the three-phase AC power supplied by the AC power supply 1 from the frequency spectrum generated by the fast Fourier transform section 406 and stored in the storage section 420, and stores the extracted component in the storage section 420 as the extracted frequency component $F_{ext}$.

The determination section 410 determines whether a voltage $V_{Fext}$ of the extracted frequency component $F_{ext}$ extracted by the extraction section 408 and stored in the storage section 420 is larger than the threshold voltage $V_{TH}$. When the voltage $V_{Fext}$ is larger than the threshold voltage $V_{TH}$, the determination section 410 outputs the open phase detection signal to the control unit 55. For example, a voltage of an extracted frequency component when there is no open phase and a voltage of an extracted frequency component when there is an open phase can be measured in advance, and an average value thereof or a value in a predetermined range with respect to the average value can be set as the threshold voltage $V_{TH}$.

Next, the open phase determination process of the open phase detection device 40 of the first embodiment will be described with reference to simulation results. In examples to be described below, it is assumed that the open phase detection device 40 sets the secondary winding 24 and the transformer output lines 25R, 25S, and 25T as the open phase detection target range and performs open phase detection.

Figure 3A:
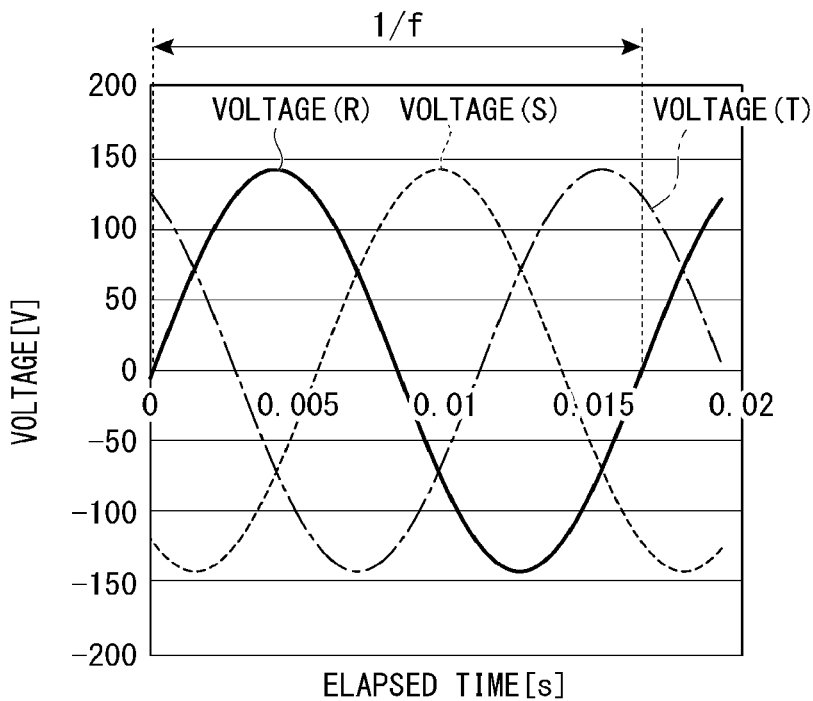
FIG. 3A is a diagram for explaining an example of a voltage waveform of three-phase AC power supplied to a transformer from an AC power supply of the first embodiment.
Figure 3B:
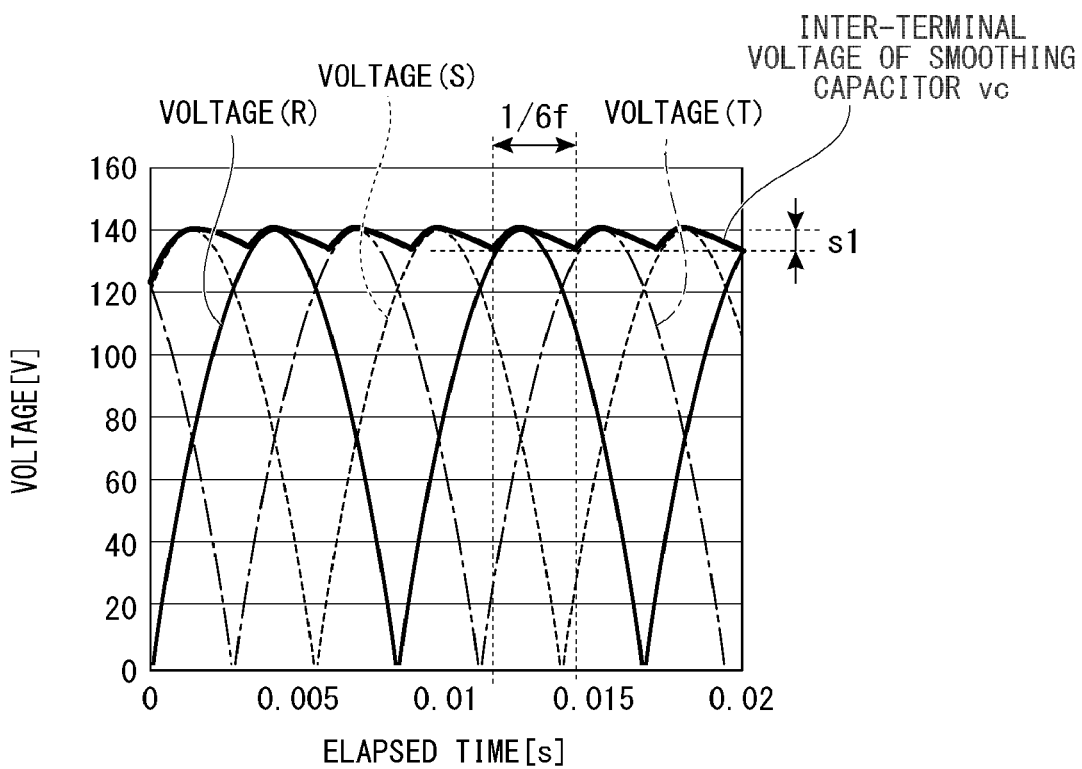
FIG. 3B is a diagram for explaining an example of a pulsating current full-wave rectified by a rectifier when there is no open phase on transformer output lines.
Figure 3C:
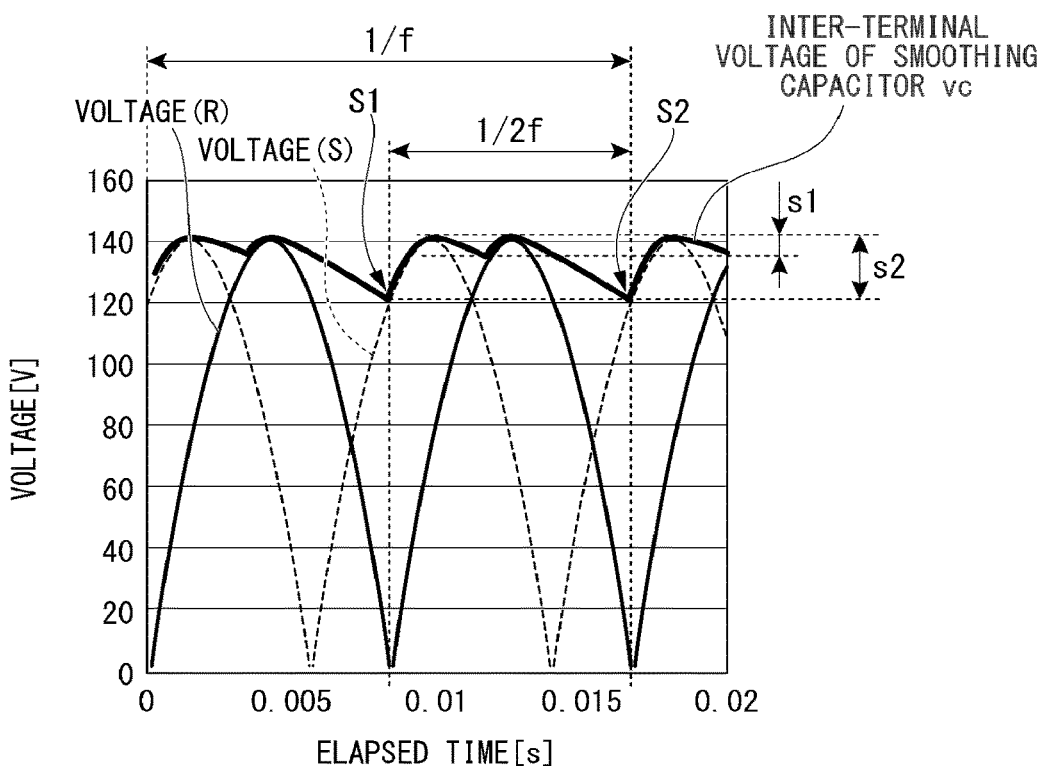
FIG. 3C is a diagram for explaining an example of a pulsating current full-wave rectified by the rectifier when there is an open phase on the transformer output lines.

With reference to FIG. 3A to FIG. 3C, the reason why a component having a frequency 2f that is twice as high as the fundamental frequency f of the AC power supply 1 appears in the inter-terminal voltage when there is an open phase will be described. FIG. 3A is a diagram for explaining an example of a voltage waveform of the three-phase AC power supplied to the transformer 20 from the AC power supply 1. FIG. 3B is a diagram for explaining an example of a pulsating current full-wave rectified by the rectifier 32 when there is no open phase on any of the secondary winding 24 and the transformer output lines 25R, 25S, and 25T. FIG. 3C is a diagram for explaining an example of a pulsating current full-wave rectified by the rectifier 32 when there is an open phase on the transformer output line 25R.

As illustrated in FIG. 3A, the length of time of one cycle in the three-phase AC power output from the AC power supply 1 is represented by the reciprocal 1/f of the fundamental frequency f of the AC power supply 1. The voltage waveform of a pulsating current after such three-phase AC power is full-wave rectified by the rectifier 32 includes six peaks in one cycle 1/f.

In a case where there is no open phase in the open phase detection target range, when the full-wave rectified pulsating current is smoothed by the capacitor 35, the waveform of an inter-terminal voltage Vc including a ripple component is obtained as illustrated in FIG. 3B. The waveform of the inter-terminal voltage Vc has a shape such that the peaks of a full-wave rectified voltage are connected, and the period of the ripple, which is a time interval between sags, is 1/6f.

On the other hand, in the following description, it is assumed that there is an open phase on the transformer output line 25R. In such a case, the capacitor 35 is charged in the phases (S-phase and T-phase) with no open phase and is discharged in the phase (R-phase) with an open phase. This is because, in the phase (R-phase) with an open phase, power consumption by the inverse conversion device 50 exceeds a current supplied from the rectifier 32 and charge/discharge balance of the capacitor 35 becomes negative.

Therefore, as illustrated in FIG. 3C, in the waveform of the inter-terminal voltage Vc of the capacitor 35, there are sags S1 and S2 (hereinafter, referred to as large sags), in which a voltage greatly drops compared with other sags, in the phase (R-phase) with an open phase. Since each phase voltage of the full-wave rectified pulsating current has two peaks per cycle 1/f, the large sag occurs twice per cycle 1/f. Therefore, when there is an open phase, the inter-terminal voltage Vc includes the component having the frequency 2f that is twice as high as the fundamental frequency f of the AC power supply 1. Accordingly, the aforementioned open phase detection device 40 detects the component having the frequency 2f that is twice as high as the fundamental frequency f of the AC power supply 1, thereby enabling open phase detection.

Figure 4:
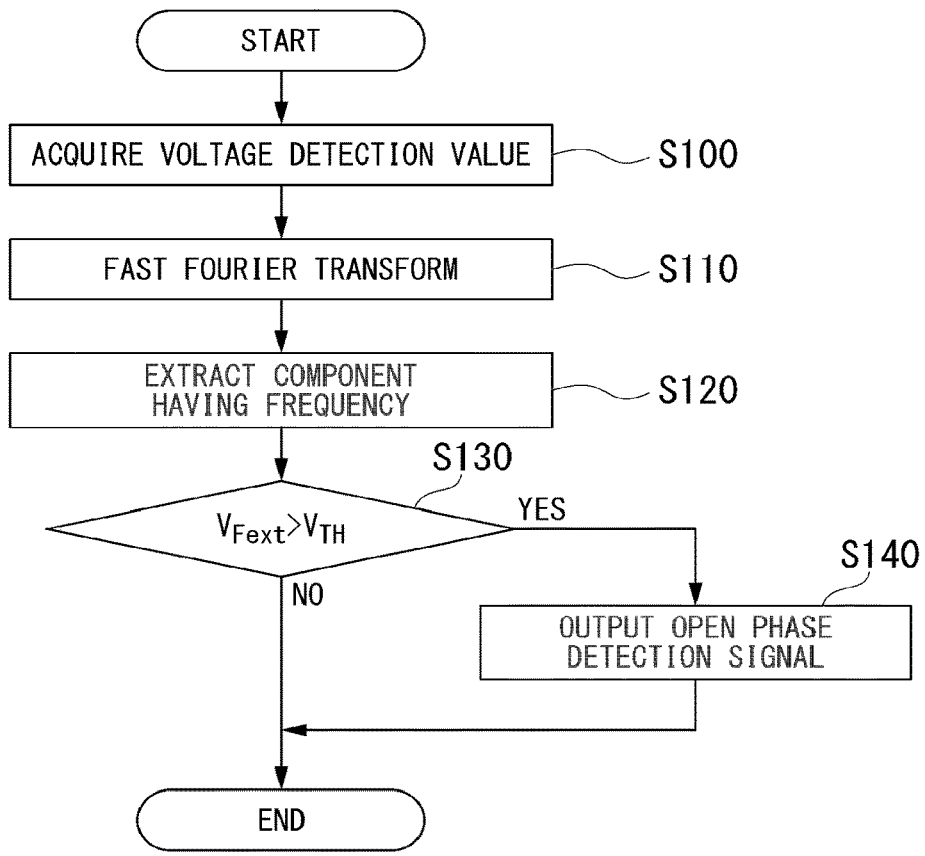
FIG. 4 is a flowchart of an open phase determination process of the open phase detection device of the first embodiment.

FIG. 4 is a flowchart of the open phase determination process of the open phase detection device 40 of the first embodiment. Although not illustrated in the flowchart, it is assumed that the voltage acquisition process, in which the voltage detector 42 detects the voltage value representing the inter-terminal voltage and the acquisition section 404 acquires the voltage value and stores the voltage value in the storage section 420, is performed in parallel with the process illustrated in FIG. 4.

The power conversion system 2 performs the open phase determination process at predetermined time intervals or when a specific condition is satisfied (when a specific event occurs).

The open phase determination process will be described below. First, the acquisition section 404 acquires the voltage value stored in the storage section 420 and representing the predetermined number of inter-terminal voltages and outputs the voltage value to the fast Fourier transform section 406 (step S100). Next, the fast Fourier transform section 406 generates the frequency spectrum by performing FFT processing on the voltage value representing the predetermined number of inter-terminal voltages received from the acquisition section 404, and stores the generated frequency spectrum in the storage section 420 (step S110) Next, the extraction section 408 extracts the component having the frequency that is twice as high as the fundamental frequency of the three-phase AC power supplied by the AC power supply 1, from the frequency spectrum stored in the storage section 420, and stores the extracted component in the storage section 420 as the extracted frequency component $F_{ext}$ (step S120).

Next, the determination section 410 determines whether the voltage $V_{Fext}$ of the extracted frequency component $F_{ext}$ stored in the storage section 420 is larger than the threshold voltage $V_{TH}$ (step S130). When the voltage $V_{Fext}$ is larger than the threshold voltage $V_{TH}$, the determination section 410 advances the process to step S140 and outputs the open phase detection signal to the control unit 55. On the other hand, when the voltage $V_{Fext}$ is equal to or less than the threshold voltage $V_{TH}$, the determination section 410 ends the open phase determination process.

According to the first embodiment, based on a component having a frequency that is twice as high as a fundamental frequency of an alternating current of a plurality of phases included in frequency components of a voltage smoothed by the capacitor 35, it is detected that an open phase has occurred in the alternating current of the plurality of phases. In this way, it is possible to detect an open phase based on the inter-terminal voltage of the capacitor 35 detected by the voltage detector 42, thereby facilitating open phase detection.

Furthermore, according to the first embodiment, the frequency spectrum of the voltage smoothed by the capacitor 35 is derived by the FFT processing, and the component having the frequency that is twice as high as the fundamental frequency is extracted from the frequency spectrum. In this way, it is possible to detect an open phase simply by performing arithmetic processing on the inter-terminal voltage, so that it is possible to implement open phase detection with a minimum addition of hardware.

Furthermore, according to the first embodiment, when the voltage of the component having the frequency that is twice as high as the fundamental frequency from the frequency spectrum is larger than the predetermined threshold voltage $V_{TH}$, it is determined that an open phase has occurred in the open phase detection target range. In this way, it is possible to detect an open phase by the voltage level of the frequency that is twice as high as the fundamental frequency of the AC power supply 1 in the frequency spectrum derived from the inter-terminal voltage, thereby enabling appropriate open phase detection.

Second Embodiment

Figure 5:
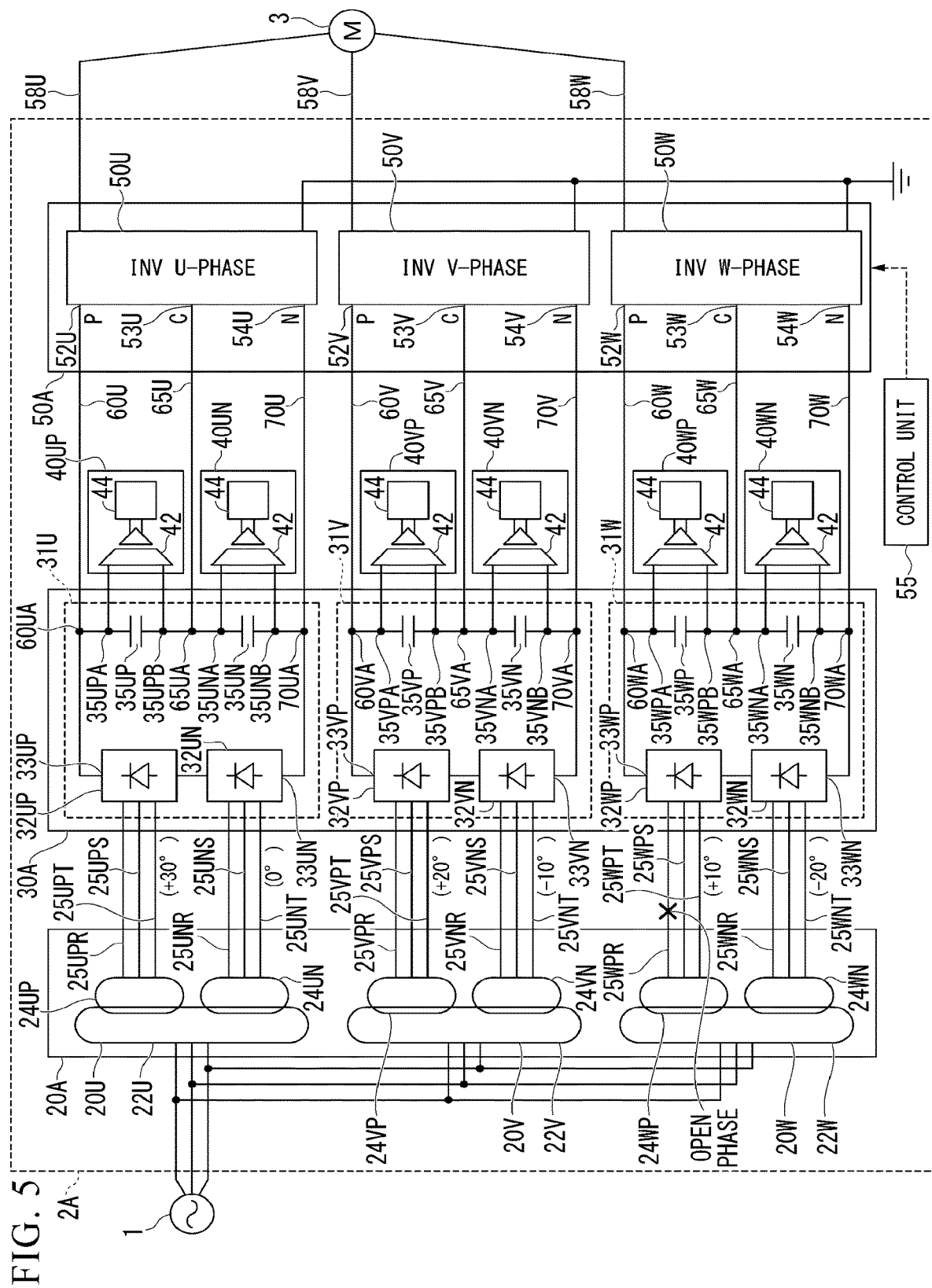
FIG. 5 is a configuration diagram of a power conversion system of a second embodiment.

FIG. 5 is a configuration diagram of a power conversion system 2A of a second embodiment. The forward conversion device 30 of the power conversion system 2 of the first embodiment is what is called a six-pulse diode converter (forward conversion device 30). A forward conversion device group 30A of the power conversion system 2A of the second embodiment is what is called a 36-pulse diode converter.

FIG. 5 illustrates the AC power supply 1, the power conversion system 2A, and the electric motor 3.

The power conversion system 2A includes, for example, a transformer group 20A, the forward conversion device group 30A, open phase detection devices 40UP, 40UN, 40VP, 40VN, 40WP, and 40WN, and an inverse conversion device group 50A Similarly to the power conversion system 2, the power conversion system 2A forward-converts three-phase AC power, which is supplied from the AC power supply 1, to generate DC power, inversely converts the DC power to generate three-phase AC power, and supplies the three-phase AC power to the electric motor 3. However, the power conversion system 2A is different from the power conversion system 2 in that the U-phase, V-phase, and W-phase AC power to be supplied to the electric motor 3 is supplied from separate forward conversion devices 31U, 31V, and 31W and inverse conversion devices 50U, 50V, and 50W, respectively. Note that, in the following description, when the open phase detection devices 40UP, 40UN, 40VP, 40VN, 40WP, and 40WN are not particularly distinguished from one another, they are simply referred to as the open phase detection device 40.

The transformer group 20A includes, for example, a transformer 20U, a transformer 20V, and a transformer 20W. Each of the transformers 20U, 20V, and 20W is a three-winding transformer in which a connection method on a secondary side is different. Since the transformers 20U, 20V, and 20W have the same configuration, the transformer 20U will be described below as a representative.

The transformer 20U includes, for example, a primary winding 22U, a secondary winding 24UP, and a tertiary winding 24UN. The transformer 20U receives the supply of the three-phase AC power from the AC power supply 1 through the primary winding 22U, transforms the received three-phase AC power, and outputs the transformed three-phase AC power from the secondary winding 24UP and the tertiary winding 24UN. Each of the secondary winding 24UP and the tertiary winding 24UN has, for example, a start connection and a delta connection, so that the three-phase AC power output from the secondary winding 24UP has a phase advanced by 30° with respect to the three-phase AC power output from the tertiary winding 24UN.

The three-phase AC power output from the secondary winding 24UP and the tertiary winding 24UN is output to the forward conversion device 31U via transformer output lines 25UPR, 25UPS, 25UPT, 25UNR, 25UNS, and 25UNT. Phase currents of R-phase, S-phase, and T-phase flow through the transformer output lines 25UPR, 25UPS, and 25UPT, respectively, as line currents. The line currents of R-phase, S-phase, and T-phase, which have potentials different from those of the transformer output lines 25UPR, 25UPS, and 25UPT and phases shifted by 30° from the transformer output lines 25UPR, 25UPS, and 25UPT, flow through the transformer output lines 25UNR, 25UNS, and 25UNT. The transformer 20V and the transformer 20W are configured similarly to the transformer 20U. Regarding the transformer 20V and the transformer 20W, a description thereof is incorporated by replacing U in the reference numerals of the constituent elements in the description of the transformer 20U with V and W, respectively.

The forward conversion device group 30A includes, for example, forward conversion devices 31U, 31V, and 31W. Since the forward conversion devices 31U, 31V, and 31W have the same configuration, the forward conversion device 31U will be described below as a representative. The forward conversion device 31U includes, for example, a rectifier 32UP, a rectifier 32UN, a capacitor 35UP, and a capacitor 35UN.

Each of the rectifiers 32UP and 32UN is a three-phase full-bridge diode rectification circuit. An AC side of the rectifier 32UP is connected to the secondary winding 24UP via the transformer output lines 25UPR, 25UPS, and 25UPT. An AC side of the rectifier 32UN is connected to the tertiary winding 24UN via the transformer output lines 25UNR, 25UNS, and 25UNT. Load sides of the rectifiers 32UP and 32UN are connected in series with each other. DC power rectified by the rectifiers 32UP and 32UN connected in series with each other is output from a rectifier positive electrode terminal 33UP and a rectifier negative electrode terminal 33UN.

The rectifier positive electrode terminal 33UP is connected to one end of a positive electrode line 60U. The other end of the positive electrode line 60U is connected to a positive electrode input terminal 52U of the inverse conversion device 50U. The rectifier negative electrode terminal 33UN is connected to one end of a negative electrode line 70U. The other end of the negative electrode line 70U is connected to a negative electrode input terminal 54N of the inverse conversion device 50U.

Since each of the rectifiers 32UP and 32UN receives the supply of AC power having different potentials from the secondary winding 24UP and the tertiary winding 24UN of the transformer 20U, the outputs of the rectifiers 32UP and 32UN are connected in series, so that the total voltage of an output voltage of the rectifier 32UP and an output voltage of the rectifier 32UN is output from the rectifier positive electrode terminal 33UP and the rectifier negative electrode terminal 33UN.

The capacitor 35UP and the capacitor 35UN are connected in series with each other and are connected between the positive electrode line 60U and the negative electrode line 70U, thereby smoothing the DC power output from the forward conversion device 31U.

A connection point 65UA between the capacitor 35UP and the capacitor 35UN is connected to a neutral line 65U. The capacitor 35UP and the capacitor 35UN have substantially the same capacitance such that the potential of the connection point 65UA to the neutral line 65U is an intermediate potential between the positive electrode line 60U and the negative electrode line 70U.

That is, in the forward conversion device 31U, the rectifiers 32UP and 32UN output a pulsating current by rectifying the AC power supplied from the transformer 20U, and the capacitor 35UP and the capacitor 35UN output DC power by smoothing the pulsating current output from the rectifiers 32UP and 32UN and supply the DC power to the inverse conversion device 50U.

The forward conversion devices 31V and 31W are also configured similarly to the forward conversion device 31U. Regarding the forward conversion devices 31V and 31W, a description thereof is incorporated by replacing U in the reference numerals of the constituent elements in the description of the forward conversion device 31U with V and W, respectively. Note that, in the following description, when the capacitors 35UP, 35UN, 35VP, 35VN, 35WP, and 35WN are not particularly distinguished from one another, they are referred to as the capacitor 35.

The open phase detection device 40UP is connected to a positive electrode terminal 35UPA and a negative electrode terminal 35UPB of the capacitors 35UP. The open phase detection device 40UN is connected to a positive electrode terminal 35UNA and a negative electrode terminal 35UNB of the capacitor 35UN.

The open phase detection device 40VP is connected to a positive electrode terminal 35VPA and a negative electrode terminal 35VPB of the capacitors 35VP. The open phase detection device 40VN is connected to a positive electrode terminal 35VNA and a negative electrode terminal 35VNB of the capacitor 35VN.

The open phase detection device 40WP is connected to a positive electrode terminal 35WPA and a negative electrode terminal 35WPB of the capacitor 35WP. The open phase detection device 40WN is connected to a positive electrode terminal 35WNA and a negative electrode terminal 35WNB of the capacitor 35WN.

In the following description, when the open phase detection devices 40UP, 40UN, 40VP, 40VN, 40WP, and 40WN are not particularly distinguished from one another, they are referred to as the open phase detection device 40.

Each of the open phase detection devices 40UP, 40UN, 40VP, 40VN, 40WP, and 40WN has the same configuration as that of the open phase detection device 40 of the first embodiment; however, an open phase determination process of the second embodiment is different from the open phase determination process of the first embodiment in that the determination section 410 performs determination based on a first threshold voltage $V_{TH1}$ and a second threshold voltage $V_{TH2}$. The open phase determination process of the second embodiment will be described below.

The inverse conversion device group 50A includes, for example, the inverse conversion devices 50U, 50V, and 50W. Since the inverse conversion devices 50U, 50V, and 50W have the same configuration, the inverse conversion device 50U will be described below as a representative. The inverse conversion device 50U is, for example, a full-bridge NPC (neutral-point-clamped) five-level inverter.

The inverse conversion device 50U is PWM-controlled to convert the DC power, which is supplied from the forward conversion device 30U via the positive electrode line 60U and the negative electrode line 70U, into three-phase AC power having a variable frequency and a variable voltage. The inverse conversion device 50U supplies the converted U-phase AC power to the electric motor 3 via a load power line 58U. The inverse conversion devices 50V and 50W are also configured similarly to the inverse conversion device 50U. Regarding the inverse conversion devices 50V and 50W, a description thereof is incorporated by replacing U in the reference numerals of the constituent elements in the description of the inverse conversion device 50U with V and W, respectively.

Next, the open phase determination process of the open phase detection devices 40UP, 40UN, 40VP, 40VN, 40WP, and 40WN in the second embodiment will be described. In the following description, as an example, a description will be given assuming that the open phase detection device 40WP detects an open phase on a transformer output line 25WPR of the transformer 20W. Therefore, in the following description, "when there is an open phase" means that there is an open phase on the transformer output line 25WPR of the transformer 20W.

In the following description, "when there is no open phase" means that there is no open phase on any of the secondary winding 24UP, the tertiary winding 24UN, a secondary winding 24VP, a tertiary winding 24VN, a secondary winding 24WP, a tertiary winding 24WN, the transformer output lines 25UPR, 25UPS, 25UPT, 25UNR, 25UNS, and 25UNT of the transformer 20U, transformer output lines 25VPR, 25VPS, 25VPT, 25VNR, 25VNS, and 25VNT of the transformer 20V, and transformer output lines 25WPR, 25WPS, 25WPT, 25WNR, 25WNS, and 25WNT of the transformer 20W.

Figure 6C:
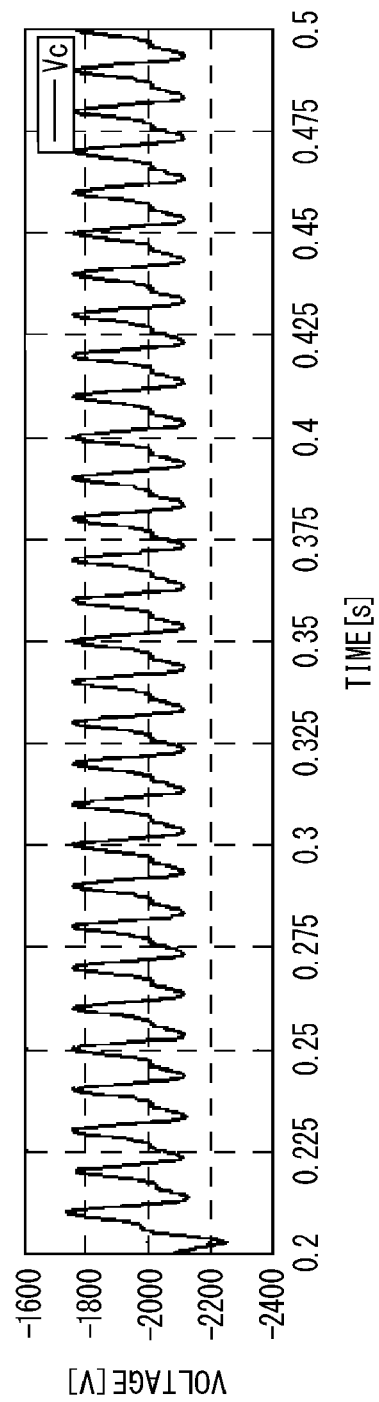
FIG. 6C is a diagram illustrating a simulation result of an inter-terminal voltage by the open phase detection device of the second embodiment when there is an open phase.
Figure 6D:
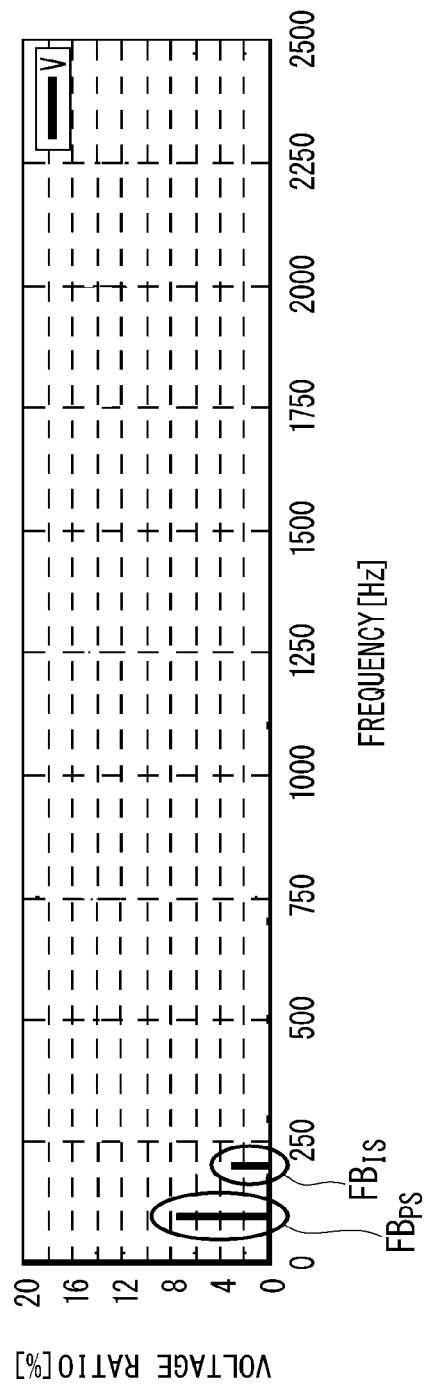
FIG. 6D is a diagram illustrating a simulation result of a frequency spectrum by the open phase detection device of the second embodiment when there is an open phase.

FIG. 6A is a diagram illustrating a simulation result of an inter-terminal voltage detected by the open phase detection device 40WP of the second embodiment when there is no open phase. FIG. 6B is a diagram illustrating a simulation result of a frequency spectrum generated by the open phase detection device 40WP of the second embodiment when there is no open phase. FIG. 6C is a diagram illustrating a simulation result of an inter-terminal voltage detected by the open phase detection device 40WP of the second embodiment when there is an open phase. FIG. 6D is a diagram illustrating a simulation result of a frequency spectrum generated by the open phase detection device 40WP of the second embodiment when there is an open phase.

From FIG. 6A to FIG. 6D, it is assumed that the fundamental frequency of the AC power supply 1 is 50 Hz and the output frequency of the inverse conversion device group 50A is 100 Hz.

In FIG. 6A and FIG. 6C, a horizontal axis denotes time [seconds]. A vertical axis in FIG. 6A denotes a voltage [V] generated between the positive electrode terminal 35WPA and the negative electrode terminal 35WPB of the capacitor 35WP. A vertical axis in FIG. 6C denotes a voltage [V] generated between the positive electrode terminal 35WPA and the negative electrode terminal 35WPB of the capacitor 35WN.

In FIG. 6B and FIG. 6D, a horizontal axis denotes a frequency [Hz] and a vertical axis denotes a voltage ratio [%] of voltage values of frequency components of an inter-terminal voltage based on the result of the FFT. For example, the voltage ratio is a ratio of the voltage values of frequency components when the voltage value of a voltage fundamental wave of the AC power supply is set to 100% as a reference. Note that since the voltage ratio is a ratio of voltage values, a reference voltage value may be an effective value or a peak value. Furthermore, as illustrated in the drawings, the voltage value of an effective value of the fundamental wave of the AC power supply appears at the frequency of 0 Hz. However, in FIG. 6B and FIG. 6D, only a part of the voltage values of the effective value of the fundamental wave of the AC power supply are illustrated because the scale is shown by enlarging and displaying the range of the voltage ratio of 0% to 20%.

When there is no open phase, since the full-wave rectified voltages output from the capacitors 32WP and 32WN are DC voltages including ripples with a period of ⅙f as described in FIG. 3B, the voltage detector 42 detects a DC voltage having a waveform as illustrated in FIG. 6A.

The fast Fourier transform section 406 generates a frequency spectrum as illustrated in FIG. 6B by performing a fast Fourier transform (FFT transform) on the detection value of the waveform as illustrated in FIG. 6A, which is detected by the voltage detector 42. The frequency spectrum as illustrated in FIG. 6B includes a component $FB_{IS}$ having a frequency of 200 Hz that is twice as high as an output frequency 100 Hz of the inverse conversion device 50. However, the frequency spectrum does not include a component having a frequency of 100 Hz that is twice as high as the fundamental frequency 50 Hz of the AC power supply 1.

When there is an open phase, since the full-wave rectified voltages output from the capacitors 32WP and 32WN are DC voltages including large ripples with a period of ½f as described in FIG. 3C, the voltage detector 42 detects a DC voltage having a waveform as illustrated in FIG. 6C.

The fast Fourier transform section 406 generates a frequency spectrum as illustrated in FIG. 6D by performing a fast Fourier transform (FFT transform) on the detection value of the waveform as illustrated in FIG. 6C, which is detected by the voltage detector 42. The frequency spectrum as illustrated in FIG. 6D includes the component $FB_{IS}$ having the frequency of 200 Hz that is twice as high as the output frequency 100 Hz of the inverse conversion device 50. Moreover, the frequency spectrum includes a component $FB_{PS}$ having a frequency of 100 Hz that is twice as high as the fundamental frequency 50 Hz of the AC power supply 1.

Next, with reference to FIGS. 7A to 7F, in the open phase determination process of the open phase detection device 40 of the second embodiment, a simulation result when the output frequency of the inverse conversion device 50 and the fundamental frequency of the AC power supply 1 are changed will be described.

In the following description, in the frequency spectrum generated by performing the fast Fourier transform on the inter-terminal voltage, a component having a frequency of 100 Hz that is twice as high as the fundamental frequency 50 Hz of the AC power supply 1 is referred to as a "double power supply frequency component".

Figure 7A:
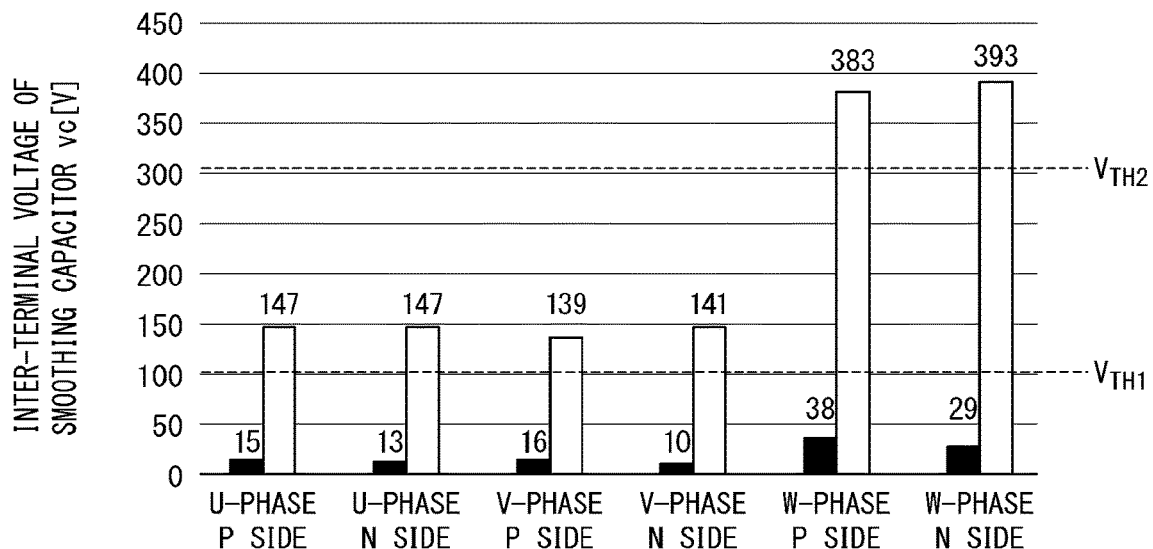
FIG. 7A is a diagram illustrating a simulation result of a double power supply frequency component when an output frequency of an inverse conversion device group is 50 Hz and a power supply frequency is 25 Hz in the power conversion system of the second embodiment.
Figure 7B:
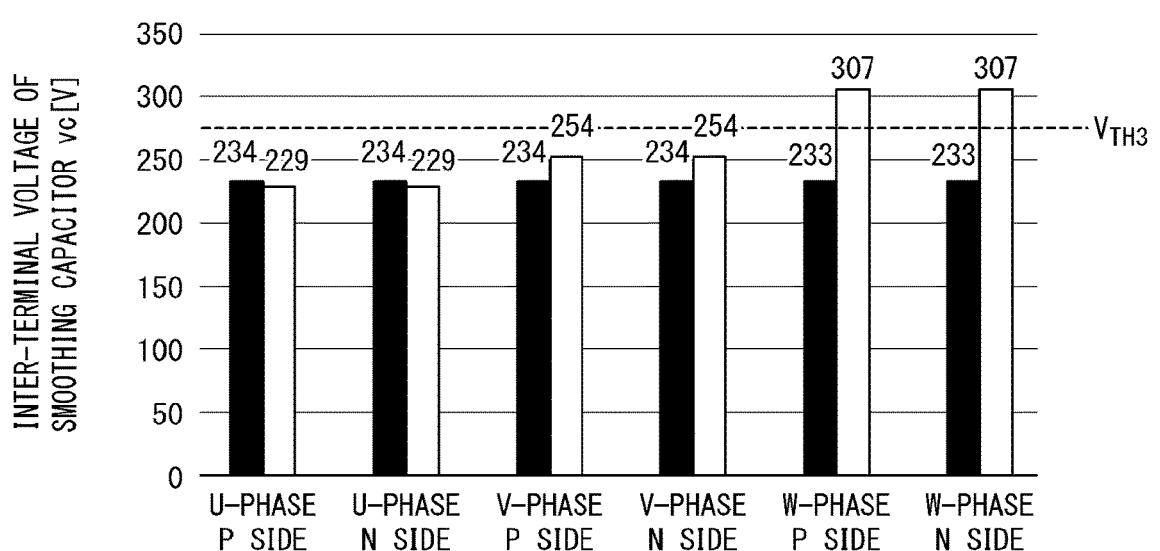
FIG. 7B is a diagram illustrating a simulation result of the double power supply frequency component when the output frequency of the inverse conversion device group is 50 Hz and the power supply frequency is 50 Hz in the power conversion system of the second embodiment.
Figure 7C:
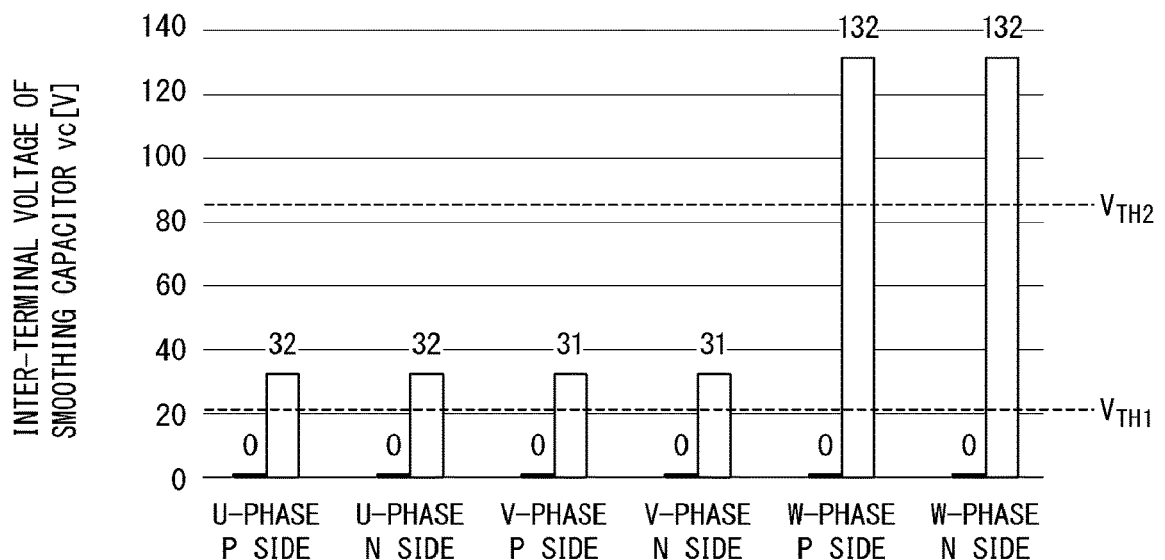
FIG. 7C is a diagram illustrating a simulation result of the double power supply frequency component when the output frequency of the inverse conversion device group is 50 Hz and the power supply frequency is 60 Hz in the power conversion system of the second embodiment.
Figure 7D:
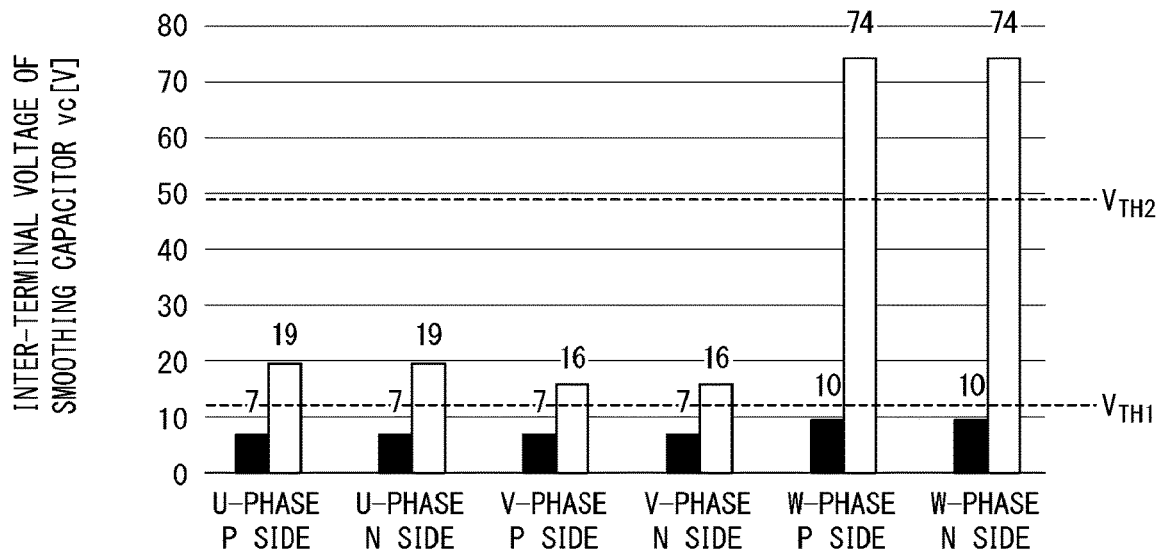
FIG. 7D is a diagram illustrating a simulation result of the double power supply frequency component when the output frequency of the inverse conversion device group is 50 Hz and the power supply frequency is 100 Hz in the power conversion system of the second embodiment.

FIG. 7A is a diagram illustrating a simulation result of the double power supply frequency component when the output frequency of the inverse conversion device group 50A is 50 Hz and the power supply frequency is 25 Hz in the power conversion system 2A of the second embodiment. FIG. 7B is a diagram illustrating a simulation result of the double power supply frequency component when the output frequency of the inverse conversion device group 50A is 50 Hz and the power supply frequency is 50 Hz in the power conversion system 2A of the second embodiment. FIG. 7C is a diagram illustrating a simulation result of the double power supply frequency component when the output frequency of the inverse conversion device group 50A is 50 Hz and the power supply frequency is 60 Hz in the power conversion system 2A of the second embodiment. FIG. 7D is a diagram illustrating a simulation result of the double power supply frequency component when the output frequency of the inverse conversion device group 50A is 50 Hz and the power supply frequency is 100 Hz in the power conversion system 2A of the second embodiment.

That is, the simulation conditions of FIGS. 7A to 7D are that the output frequency of the inverse conversion device group 50A is fixed at 50 Hz and the fundamental frequency of the AC power supply 1 is set to 25 Hz in FIG. 7A, is set to 50 Hz in FIG. 7B, is set to 60 Hz in FIG. 7C, and is set to 100 Hz in FIG. 7D. In each of FIGS. 7A to 7D, a black bar (left) indicates the double power supply frequency component when there is no open phase and a white bar (right) indicates the double power supply frequency component when there is an open phase on the transformer output line 25WPR.

In the simulation results of FIGS. 7A to 7D, the simulation results of FIGS. 7A, 7C, and 7D show a similar trend. Hereinafter, FIG. 7A will be described as an example. When the fundamental frequency of the AC power supply 1 is set to 25 Hz, the voltage of the double power supply frequency component detected by all the open phase detection devices increases when there is an open phase on the transformer output line 25WPR and becomes larger than the first threshold voltage $V_{TH1}$. Particularly, the voltage of the double power supply frequency component detected by the open phase detection devices 40WP and 40WN increases significantly as compared with other cases there is an open phase on the transformer output line 25WPR and becomes larger than the second threshold voltage $V_{TH2}$. The first threshold voltage $V_{TH1}$ and the second threshold voltage $V_{TH2}$ will be described below.

The simulation result of FIG. 7B shows a trend different from in the simulation results of FIGS. 7A, 7C, and 7D described above. In the simulation conditions of FIG. 7B, the fundamental frequency 50 Hz of the AC power supply 1 is the same as the output frequency 50 Hz of the inverse conversion device group 50A. Therefore, in the simulation result of FIG. 7B, even when there is no open phase, the voltage of the double power supply frequency component is higher than those of the simulation results of FIGS. 7A, 7C, and 7D. When the state in which there is no open phase is changed to the state in which there is an open phase, the double power supply frequency component increases, but the change is slight. Accordingly, it may be difficult to distinguish the state in which there is no open phase and the state in which there is an open phase. For example, in the double power supply frequency component detected by the open phase detection devices 40UP and 40UN, there is almost no difference between the state in which there is no open phase and the state in which there is an open phase. Furthermore, in the double power supply frequency component detected by the open phase detection devices 40VP and 40VN, there is a difference between the state in which there is no open phase from the state in which there is an open phase, but the magnitude thereof is smaller than the difference in the simulation results of FIGS. 7A, 7C, and 7D.

Therefore, in the simulation of FIG. 7B, the voltage of the double power supply frequency component detected by the open phase detection device 40WP increases when there is an open phase on the transformer output line 25WPR and becomes larger than a third threshold voltage $V_{TH3}$. Accordingly, in the case of the simulation of FIG. 7B, it is possible to detect an open phase based on the inter-terminal voltages vcWP and vcWN of the capacitors 35WP and 35WN (capacitors of their own phases) receiving the supply of power from the transformer output line 25WPR in which an open phase has occurred, but it may be difficult to detect an open phase based on inter-terminal voltages of the other capacitors 35UP, 35UN, 35VP, and 35VN (capacitors other than their own phases). The third threshold voltage $V_{TH3}$ will be described below.

Figure 7E:
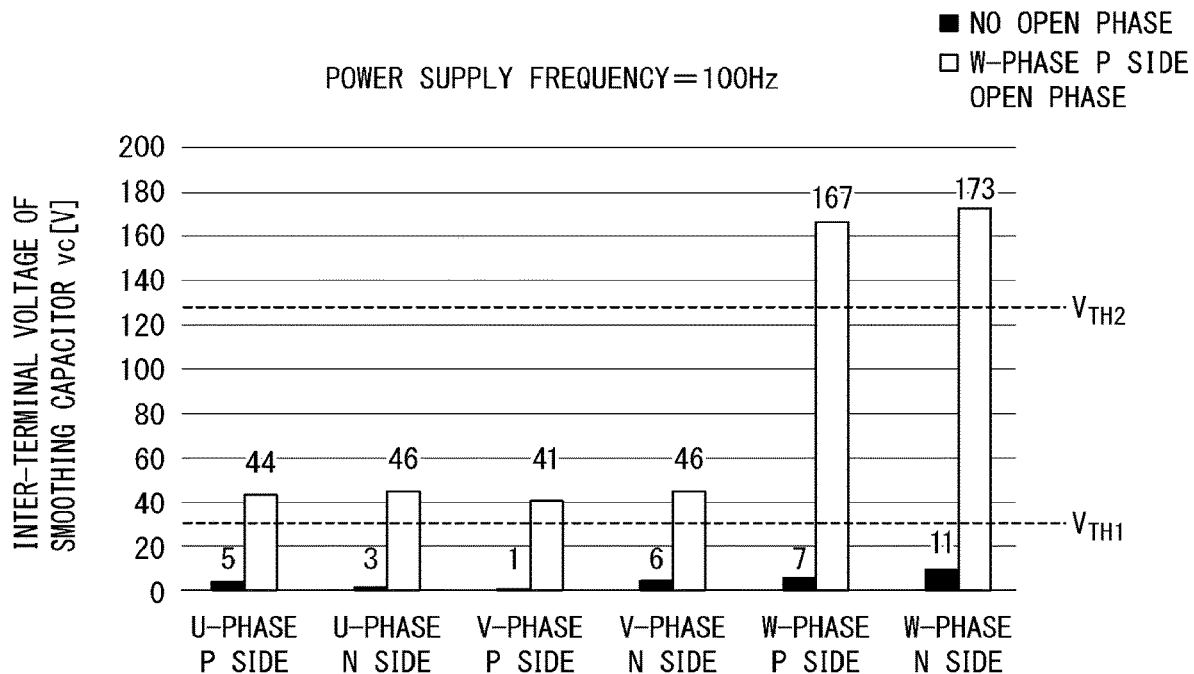
FIG. 7E is a diagram illustrating a simulation result of the double power supply frequency component when the output frequency of the inverse conversion device group is 100 Hz and the power supply frequency is 50 Hz in the power conversion system of the second embodiment.
Figure 7F:
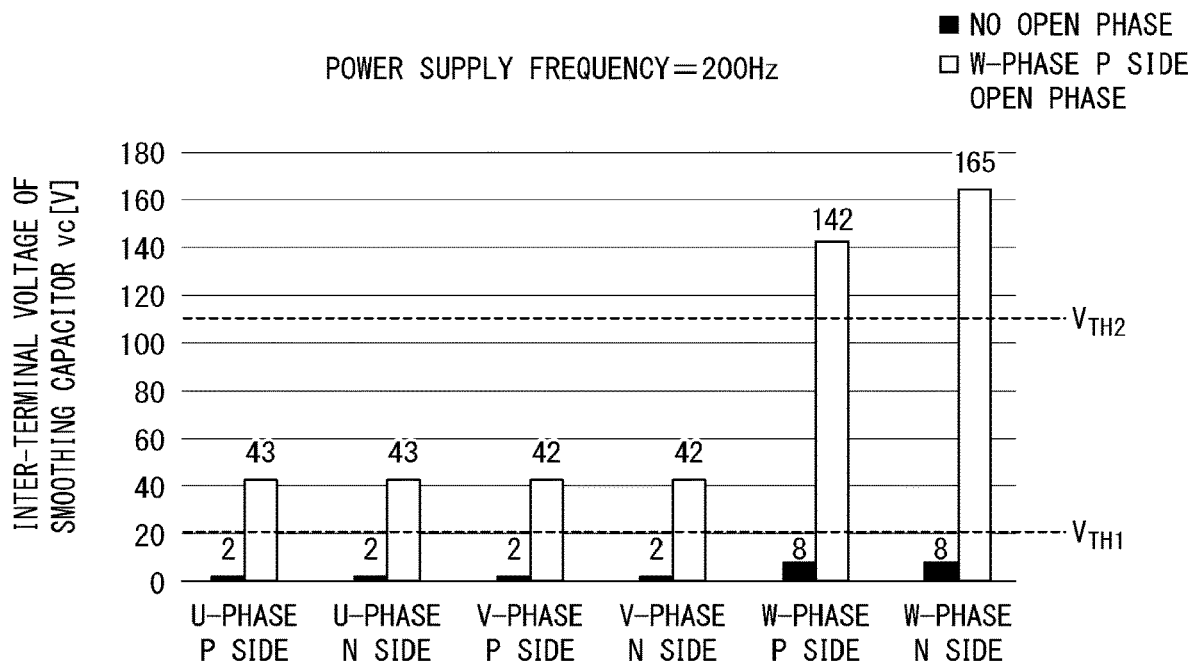
FIG. 7F is a diagram illustrating a simulation result of the double power supply frequency component when the output frequency of the inverse conversion device group is 200 Hz and the power supply frequency is 50 Hz in the power conversion system of the second embodiment.

FIG. 7E is a diagram illustrating a simulation result of the double power supply frequency component when the output frequency of the inverse conversion device group 50A is 100 Hz and the power supply frequency is 50 Hz in the power conversion system 2A of the second embodiment. FIG. 7F is a diagram illustrating a simulation result of the double power supply frequency component when the output frequency of the inverse conversion device group 50A is 200 Hz and the power supply frequency is 50 Hz in the power conversion system 2A of the second embodiment.

That is, the simulation conditions of FIGS. 7E and 7F are that the fundamental frequency of the AC power supply 1 is fixed at 50 Hz and the output frequency of the inverse conversion device group 50A is set to 100 Hz in FIG. 7E and is set to 200 Hz in FIG. 7F. In each of FIGS. 7E and 7F, a black bar (left) indicates the double power supply frequency component when there is no open phase and a white bar (right) indicates the double power supply frequency component when there is the open phase on the transformer output line 25WPR.

The simulations of FIGS. 7E and 7F show a similar trend. Hereinafter, FIG. 7E will be described as an example. When the output frequency of the inverse conversion device group 50A is set to 100 Hz, the voltage of the double power supply frequency component detected by all the open phase detection devices increases when there is an open phase on the transformer output line 25WPR and becomes larger than the first threshold voltage $V_{TH1}$. Particularly, the voltage of the double power supply frequency component detected by the open phase detection devices 40WP and 40WN increases significantly when there is an open phase on the transformer output line 25WPR and becomes larger than the second threshold voltage $V_{TH2}$.

Next, setting of the first threshold voltage $V_{TH1}$, the second threshold voltage $V_{TH2}$, and the third threshold voltage $V_{TH3}$ will be described.

The first threshold voltage $V_{TH1}$ and the second threshold voltage $V_{TH2}$ are threshold voltages used for determination by the determination section 410 when the fundamental frequency of the AC power supply 1 and the output frequency of the inverse conversion device 50W are not substantially the same. The first threshold voltage $V_{TH1}$ is a threshold voltage used to determine whether an open phase has occurred in phases other than its own phase. The second threshold voltage $V_{TH2}$ is a threshold voltage used to determine whether an open phase has occurred in its own phase.

For example, the first threshold voltage $V_{TH1}$ may be an average value $V_{avgTH1}$ of an average value $V_{avg\_all}$ of the voltages of the double power supply frequency components of all phases when there is no open phase and an average value $V_{avg\_nonop}$ of the voltages of the double power supply frequency components of phases other than a phase having the open phase when there is the open phase, or may be a value in a predetermined range with respect to the average value $V_{avgTH1}$. Specifically, the first threshold voltage $V_{TH1}$ may be the average value $V_{avgTH1}$ of the average value $V_{avg\_all}$ of the voltages of the double power supply frequency components of the inter-terminal voltages vcUP, vcUN vcVP, vcVN, vcWP, and vcWN when there is no open phase and the average value $V_{avg\_nonop}$ of the voltages of the double power supply frequency components of the inter-terminal voltages vcUP, vcUN vcVP, and vcVN when there is the open phase on the transformer output line 25WPR, or may be the value in the predetermined range with respect to the average value $V_{avgTH1}$.

For example, the second threshold voltage $V_{TH2}$ may be an average value $V_{avgTH2}$ of an average value $V_{avg\_all}$ of the voltages of the double power supply frequency components of all phases when there is no open phase and an average value $V_{avg\_op}$ of the voltages of the double power supply frequency components of a phase having the open phase when there is the open phase, or may be a value in a predetermined range with respect to the average value $V_{avgTH2}$. Specifically, the second threshold voltage $V_{TH2}$ may be the average value $V_{avgTH2}$ of the average value $V_{avg\_all}$ of the voltages of the double power supply frequency components of the inter-terminal voltages vcUP, vcUN vcVP, vcVN, vcWP, and vcWN when there is no open phase and the average value $V_{avg\_op}$ of the voltages of the double power supply frequency components of the inter-terminal voltages vcWP and vcWN when there is the open phase on the transformer output line 25WPR, or may be the value in the predetermined range with respect to the average value $V_{avgTH1}$. The second threshold voltage $V_{TH2}$ is a value larger than the first threshold voltage $V_{TH1}$.

The third threshold voltage $V_{TH3}$ is a threshold used for determination by the determination section 410 when the fundamental frequency of the AC power supply 1 and the output frequency of the inverse conversion device 50W are substantially the same.

For example, the third threshold voltage $V_{TH3}$ may be an average value $V_{avgTH3}$ of an average value $V_{avg\_all}$ of the voltages of the double power supply frequency components of all phases when there is no open phase and an average value $V_{avg\_op}$ of the voltages of the double power supply frequency components of a phase having the open phase when there is the open phase, or may be a value in a predetermined range with respect to the average value $V_{avgTH3}$. More specifically, the third threshold voltage $V_{TH3}$ may be the average value $V_{avgTH3}$ of the average value $V_{avg\_all}$ of the voltages of the double power supply frequency components of the inter-terminal voltages vcUP, vcUN vcVP, vcVN, vcWP, and vcWN when there is no open phase and the average value $V_{avg\_op}$ of the voltages of the double power supply frequency components of the inter-terminal voltages vcWP and vcWN when there is the open phase on the transformer output line 25WPR, or may be the value in the predetermined range with respect to the average value $V_{avgTH3}$.

Furthermore, the voltage of the double power supply frequency component of each phase in the calculation of the first threshold voltage $V_{TH1}$, the second threshold voltage $V_{TH2}$, the third threshold voltage $V_{TH3}$, and the threshold voltage $V_{TH}$ may be an average value of voltages in a certain period, or an average value obtained by performing processing such as exclusion of an outlier and an abnormal value and weighting may be used.

In the open phase determination process of the second embodiment, the open phase detection device 40 performs determination as follows according to the voltage of the double power supply frequency component. Note that, in the present specification, "frequencies are substantially the same" means that frequencies are so close that they are not separable in the frequency spectrum obtained by the FFT processing.

A. Case where the fundamental frequency of the AC power supply 1 and the output frequency of the inverse conversion device group 50A do not substantially coincide with each other (A1) Case where the voltage of the double power supply frequency component is equal to or less than the first threshold voltage $V_{TH1}$:

the open phase detection device 40 determines that there is no open phase in all phases.

(A2) Case where the voltage of the double power supply frequency component is larger than the first threshold voltage $V_{TH1}$ and is equal to or less than the second threshold voltage $V_{TH2}$:

the open phase detection device 40 determines that there is an open phase in phases other than a phase to which the open phase detection device 40 is connected (other than its own phase) and there is no open phase in the phase (own phase) to which the open phase detection device 40 is connected.

(A3) Case where the voltage of the double power supply frequency component is larger than the second threshold voltage $V_{TH2}$:

the open phase detection device 40 determines that there is the open phase in the phase (own phase) to which the open phase detection device 40 is connected. Note that, in such a case, it is not possible to determine whether there is the open phase in the phases other than the phase to which the open phase detection device 40 is connected (other than its own phase).

B. Case where the fundamental frequency of the AC power supply 1 and the output frequency of the inverse conversion device group 50A substantially coincide with each other (B1) Case where the voltage of the double power supply frequency component is equal to or less than the first threshold voltage $V_{TH3}$:

the open phase detection device 40 determines that there is no open phase in the phase (own phase) to which the open phase detection device 40 is connected and determines that it is not possible to determine whether there is the open phase in the phases other than the phase to which the open phase detection device 40 is connected (other than its own phase).

(B2) Case where the voltage of the double power supply frequency component is larger than the first threshold voltage $V_{TH3}$:

the open phase detection device 40 determines that there is the open phase in the phase (own phase) to which the open phase detection device 40 is connected. Note that, in such a case, it is not possible to determine whether there is the open phase in the phases other than the phase to which the open phase detection device 40 is connected (other than its own phase).

Figure 8:
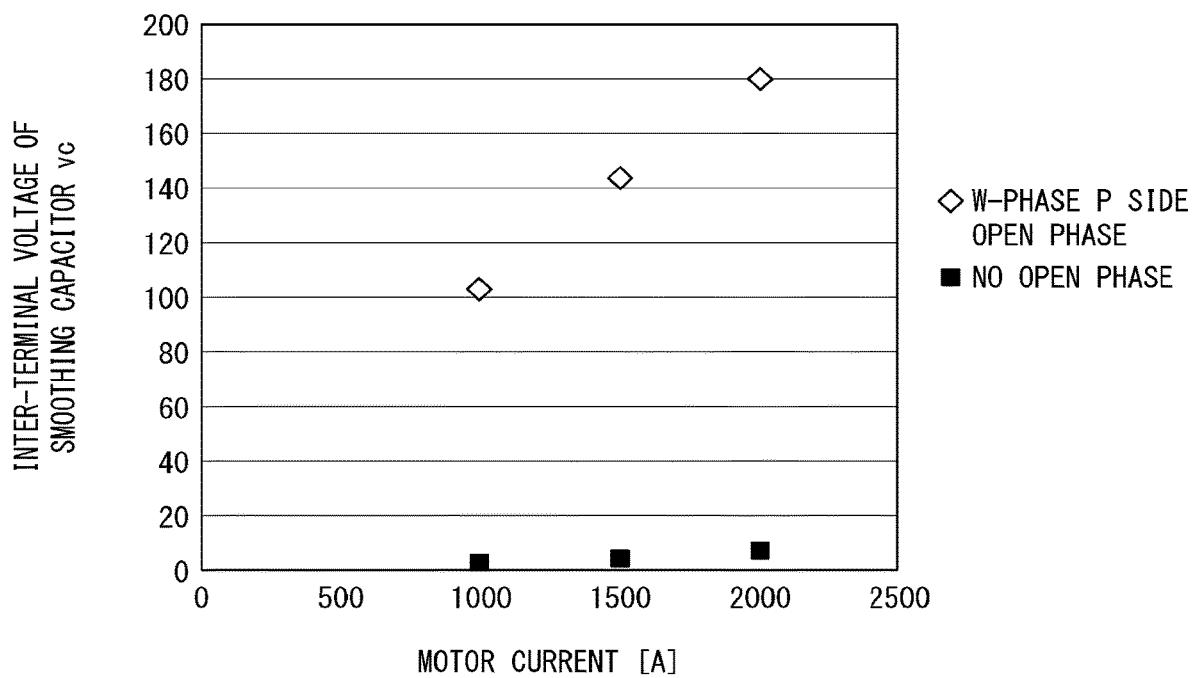
FIG. 8 is a diagram illustrating a simulation result of the double power supply frequency component when a current of an electric motor is changed in the power conversion system of the second embodiment.

FIG. 8 is a diagram illustrating the simulation result of the double power supply frequency component when the current of the electric motor 3 is changed in the power conversion system 2A of the second embodiment. In the power conversion system 2A of the second embodiment, the voltage of the double power supply frequency component varies depending on the magnitude of power consumption of a load (for example, the electric motor 3). For example, among ripples of a smoothed voltage, a ripple at the timing corresponding to a phase in which an open phase has occurred is larger than a ripple at the timing corresponding to other phases, so that the ripple increases as the voltage of the double power supply frequency component is larger than the magnitude of power consumption of the load (for example, the electric motor 3).

FIG. 8 illustrates the simulation result of the voltage of the double power supply frequency component of the inter-terminal voltage vcWP when the fundamental frequency of the AC power supply 1 is set to 50 Hz, the output frequency of the inverse conversion device group 50A is set to 100 Hz, the DC output voltage of the inverse conversion device group 50A is set to 5,700 V, the current of the electric motor 3 is changed to 1,000 A, 1,500 A, and 2,000 A. As illustrated in FIG. 8, when there is no open phase, even though the current of the electric motor 3 is changed, there is almost no change in the voltage of the double power supply frequency component. However, when there is the open phase on the transformer output line 25WPR, the voltage of the double power supply frequency component increases as the current of the electric motor 3 increases.

Figure 9:
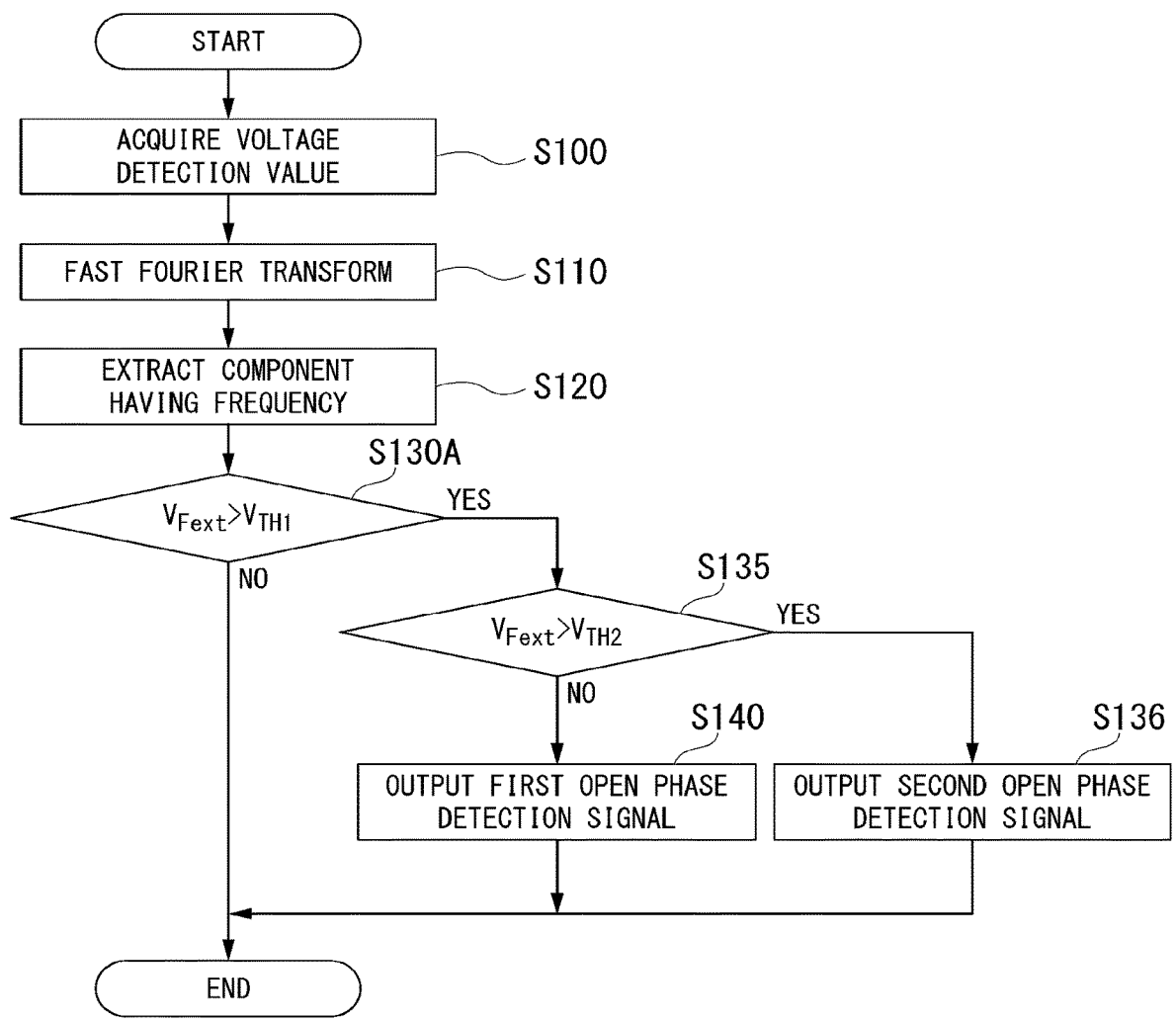
FIG. 9 is a flowchart of an open phase determination process of the open phase detection device of the second embodiment.

FIG. 9 is a flowchart of the open phase determination process by the open phase detection device of the second embodiment. Since the flowchart of FIG. 9 is the same as the flowchart of FIG. 4, except that step S130 is changed to step S130A and steps S135 and S136 are added, the same steps are denoted by the same reference numerals and a description thereof will be omitted.

After the process of step S120, the determination section 410 determines whether the voltage $V_{Fext}$ of the extracted frequency component $F_{ext}$ stored in the storage section 420 is larger than the first threshold voltage $V_{TH1}$ (step S130A). When the voltage $V_{Fext}$ is larger than the first threshold voltage $V_{TH1}$, the determination section 410 advances the process to step S135 and determines whether the voltage $V_{Fext}$ of the extracted frequency component $F_{ext}$ stored in the storage section 420 is larger than the second threshold voltage $V_{TH2}$ (step S135). When the voltage $V_{Fext}$ is larger than the second threshold voltage $V_{TH2}$, the determination section 410 outputs a second open phase detection signal to the control unit 55 (step S136). On the other hand, in step S135, when the voltage $V_{Fext}$ is equal to or less than the second threshold voltage $V_{TH2}$, the determination section 410 outputs a first open phase detection signal to the control unit 55 (step S140).

In step S130A, when the voltage $V_{Fext}$ is equal to or less than the first threshold voltage $V_{TH1}$, the determination section 410 ends the open phase determination process.

According to the second embodiment, in the power conversion system 2A including the 36-pulse diode inverter (the forward conversion device group 30A) and the five-level converter (the inverse conversion device 50), it is possible to detect an open phase based on the inter-terminal voltage of the capacitor 35 detected by the voltage detector 42.

According to the second embodiment, under the condition (the above A.) that the fundamental frequency of the AC power supply 1 and the output frequency of the inverse conversion device group 50A do not substantially coincide with each other, it is possible to detect an open phase in the following first and second cases (the above A2 and A3).

As the first case (A2), when the voltage of the double power supply frequency component is larger than the first threshold voltage $V_{TH1}$ and is equal to or less than the second threshold voltage $V_{TH2}$, the open phase detection devices 40UP, 40UN, 40VP, and 40VN determine that an open phase has occurred in a phase (for example, 25WPR) other than phases to which the open phase detection devices 40UP, 40UN, 40VP, and 40VN are connected among a plurality of phases. In this way, when the power supply frequency and the inverter frequency do not substantially coincide with each other, it is not possible to detect an open phase in a phase other than its own phase.

As the second case (A3), when the voltage of the double power supply frequency component is larger than the second threshold voltage $V_{TH2}$, the open phase detection devices 40WP and 40WN determine that an open phase has occurred in the phase (for example, 25WPR) to which the open phase detection devices 40WP and 40WN are connected among the plurality of phases. In this way, when the power supply frequency and the inverter frequency do not substantially coincide with each other, it is possible to detect an open phase in its own phase.

Furthermore, according to the second embodiment, under the condition (the above B.) that the fundamental frequency of the AC power supply 1 and the output frequency of the inverse conversion device group 50A substantially coincide with each other, it is possible to detect an open phase in the third case (the above B2).

As the third case (B2), when the voltage of the double power supply frequency component is larger than the third threshold voltage $V_{TH3}$, the open phase detection device 40WP determines that an open phase has occurred in a phase to which the open phase detection device 40WP is connected among the plurality of phases. In this way, even when the power supply frequency and the inverter frequency substantially coincide with each other, it is possible to detect an open phase in its own phase.

Modified Example of Second Embodiment

A power conversion system of the modified example of the second embodiment has the same configuration as that of the power conversion system 2A of the second embodiment, except that the open phase detection devices 40UP and 40VP are provided, but the open phase detection devices 40UN, 40VN, 40WP, and 40WN are not provided. As described above, in the case (the above A.) where the fundamental frequency of the AC power supply 1 and the output frequency of the inverse conversion device group 50A do not substantially coincide with each other, each of the open phase detection devices 40UP and 40VP can make three types of determinations of (A1) no open phase, (A2) open phase in phases other than its own phase, and (A3) open phase in its own phase, by using the first threshold voltage $V_{TH1}$ and the second threshold voltage $V_{TH2}$.

Since the open phase detection devices 40UP and 40VP are provided for the U-phase and the V-phase, respectively, it is possible to detect whether an open phase has occurred in any of the U-phase, the V-phase, the W-phase, based on the determination result of the open phase detection device 40UP and the determination result of the open phase detection device 40VP. That is, even though the open phase detection device 40 is not provided in the W-phase, for example, when both the open phase detection devices 40UP and 40VP determine that there is an open phase in phases other than its own phase (A2), it is possible to detect that there is the open phase in the W-phase. That is, when the open phase detection device 40 is provided for at least two of the U-phase, the V-phase, the W-phase, it is possible to determine whether the open phase has occurred in any of the U-phase, the V-phase, the W-phase.

Third Embodiment

Figure 10:
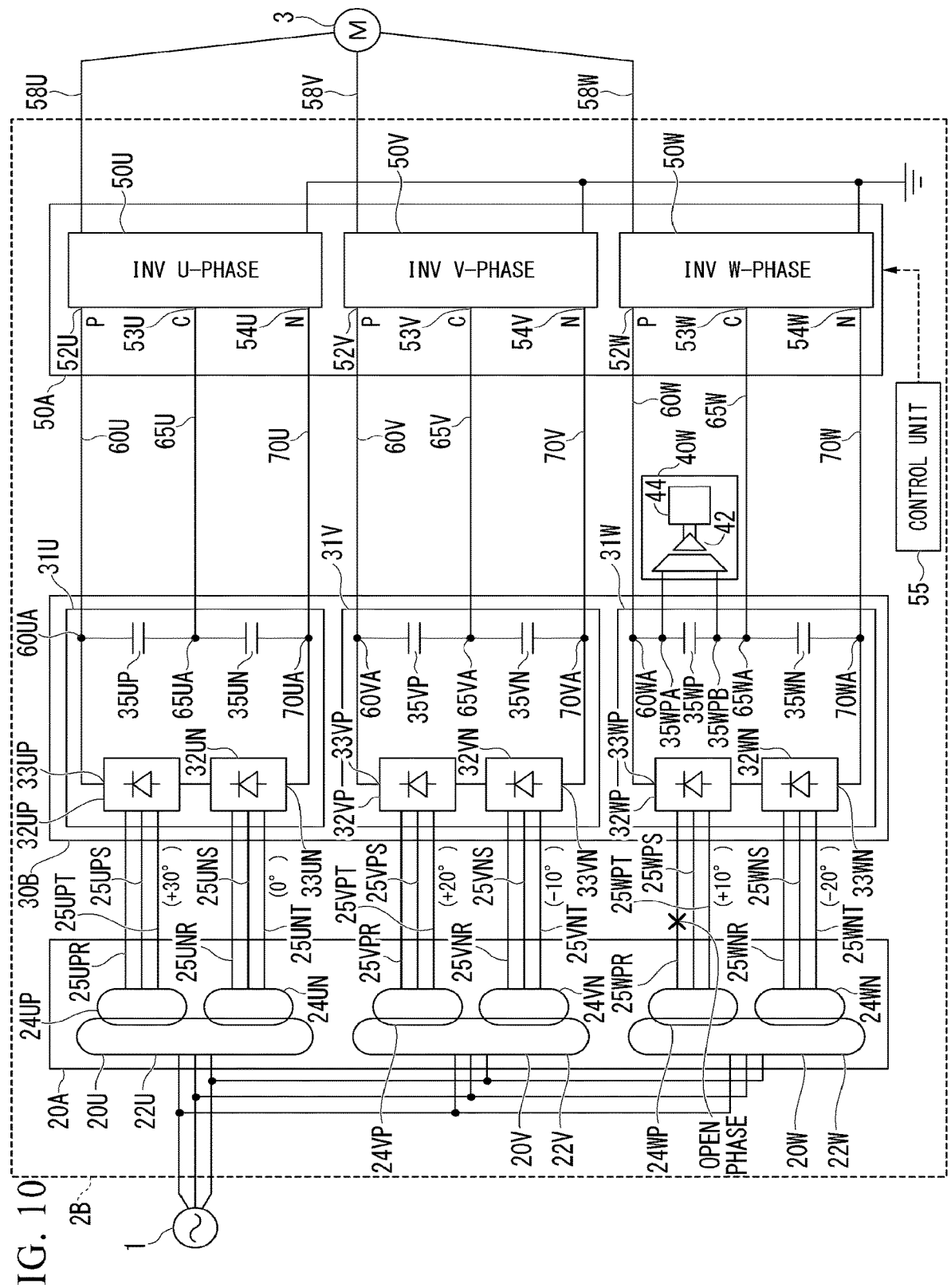
FIG. 10 is a configuration diagram of a power conversion system of a third embodiment.

FIG. 10 is a configuration diagram of a power conversion system 2B of a third embodiment. The power conversion system 2B has the same configuration as that of the power conversion system 2A of the second embodiment, except that an open phase detection device 40W is provided for the capacitor 35 WP and no open phase detection device 40 is provided for the other capacitors. In the second embodiment, the open phase detection devices 40UP, 40UN, 40VP, 40VN, 40WP, and 40WN are connected to the capacitors 35UP, 35UN, 35VP, 35VN, 35WP, and 35WN, respectively; however, in the third embodiment, the open phase detection device 40 is not connected to the capacitors 35UP, 35UN, 35VP, 35VN, 35WP, and 35WN and the open phase detection device 40W is connected to the capacitor 35WP. The open phase detection device 40WP of the third embodiment has the same configuration as that of the open phase detection device 40 of the first embodiment.

As described in the second embodiment, the open phase detection device 40W determines whether the voltage $V_{Fext}$ of the extracted frequency component $F_{ext}$ is larger than the first threshold voltage $V_{TH1}$ and the second threshold voltage $V_{TH2}$, thereby detecting an open phase of the secondary winding 24UP, the tertiary winding 24UN, the secondary winding 24VP, the tertiary winding 24VN, the transformer output lines 25UPR, 25UPS, 25UPT, 25UNR, 25UNS, and 25UNT of the transformer 20U, and the transformer output lines 25VPR, 25VPS, 25VPT, 25VNR, 25VNS, and 25VNT of the transformer 20V, in addition to detecting an open phase of the secondary winding 24WP, the tertiary winding 24WN, and the transformer output lines 25WPR, 25WPS, 25WPT, 25WNR, 25WNS, and 25WNT of the transformer 20W. However, in such a case, the condition is that the fundamental frequency of the AC power supply 1 and the output frequency of the inverse conversion device 50W are not substantially the same.

In this way, in the power conversion system 2B including the 36-pulse diode inverter (the forward conversion device group 30A) and the five-level converter (the inverse conversion device 50), even though no open phase detection device 40 is provided for all the capacitors 35UP, 35UN, 35VP, 35VN, 35WP, and 35WN, the open phase detection device 40WP is provided for the capacitor 35 WP, so that it is possible to detect an open phase in all the phases.

First Modified Example Common to Embodiment

Figure 11:
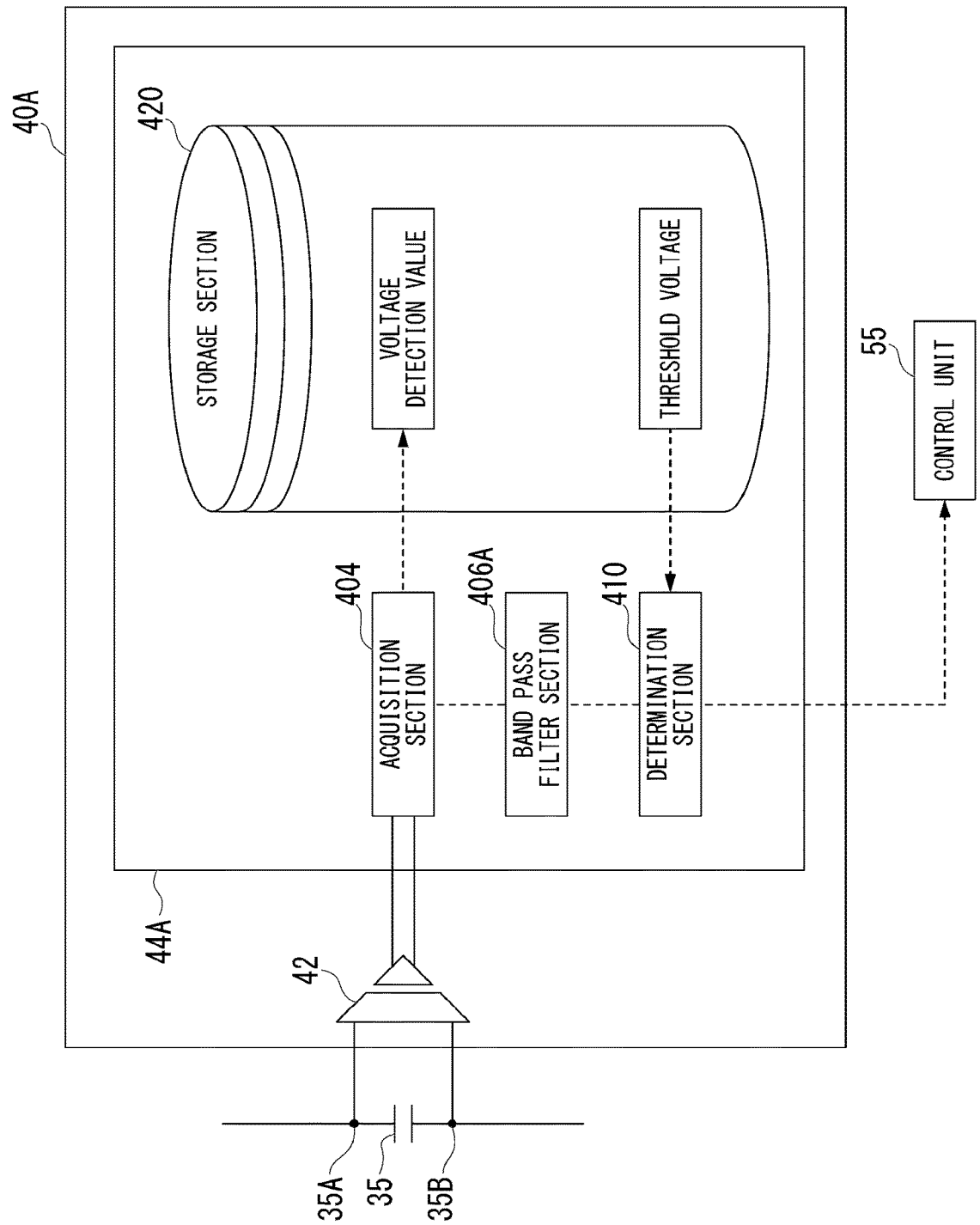
FIG. 11 is a configuration diagram of an open phase detection device of a first modified example of the first to third embodiments.
Figure 12:
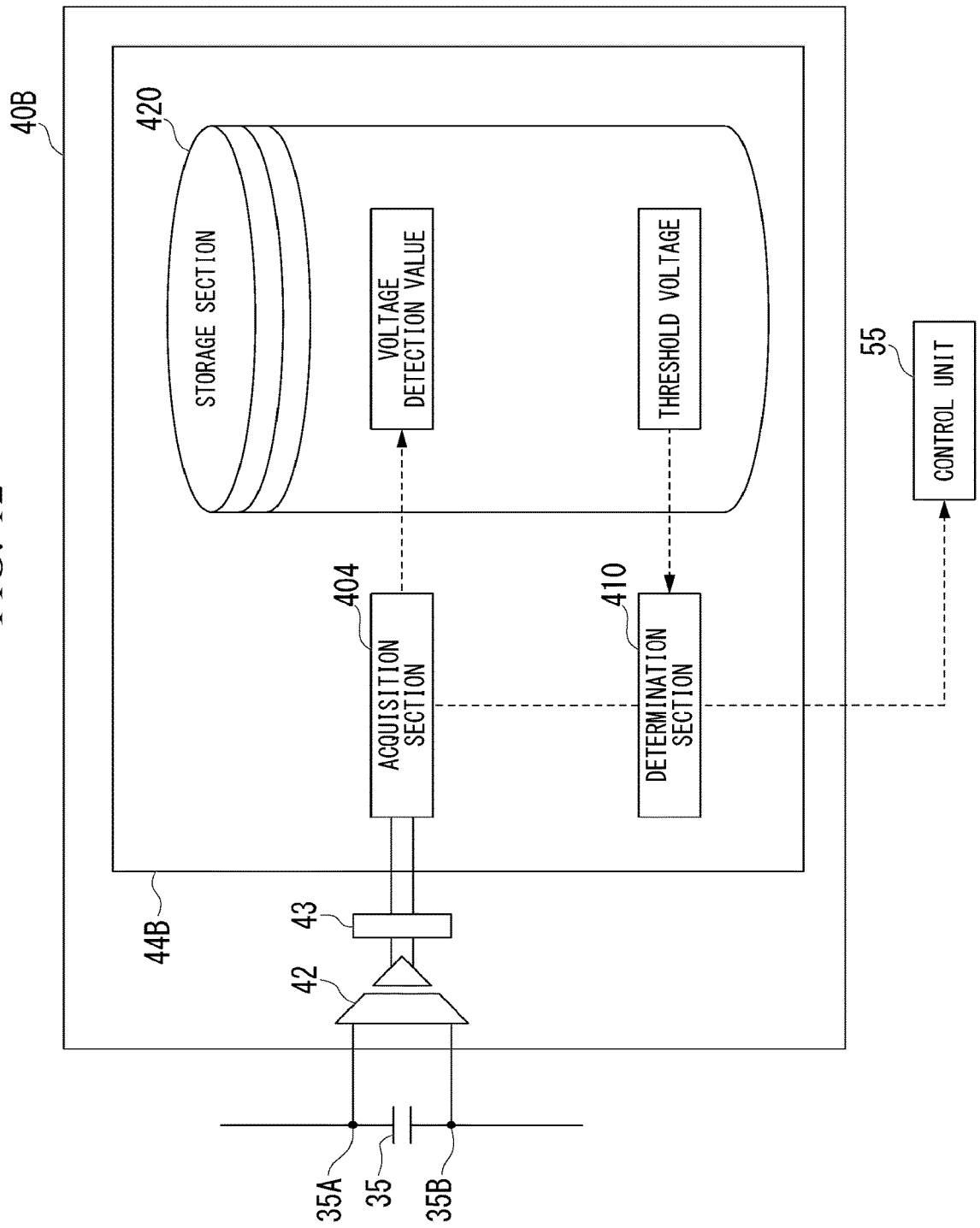
FIG. 12 is a configuration diagram of an open phase detection device of a second modified example of the first to third embodiments.

FIG. 11 is a configuration diagram of an open phase detection device 40A of a first modified example of the first to third embodiments. The open phase detection device 40A includes, for example, the voltage detector 42 and an open phase detection unit 44A. The open phase detection unit 44A has the same configuration as that of the open phase detection unit 44, except that a band pass filter section 406A is provided instead of the fast Fourier transform section 406 and the extraction section 408 in the open phase detection device 40 of the first to third embodiments.

A pass frequency band of the band pass filter section 406A includes a frequency that is twice as high as the frequency of the AC power supply 1. For example, the center frequency of the pass frequency band of the band pass filter section 406A coincides with the frequency that is twice as high as the frequency of the AC power supply 1. The band pass filter section 406A allows a component (double power supply frequency component) having a frequency corresponding to the pass frequency band among voltage detection values to pass therethrough and supplies the double power supply frequency component to the determination section 410. The determination section 410 determines that an open phase has occurred when the voltage of the double power supply frequency component is larger than a predetermined threshold voltage.

According to the open phase detection device 40A of the first modified example, the band pass filter section 406A extracts the double power supply frequency component by a frequency component selection characteristic of a band pass filter. In this way, even though the fast Fourier transform section 406 and the extraction section 408 are not provided, it is possible to extract a component in a desired pass frequency band and to detect an open phase.

Second Modified Example Common to Embodiment

FIG. 11 is a configuration diagram of an open phase detection device 40B of a second modified example of the first to third embodiments. The open phase detection device 40B includes, for example, the voltage detector 42, a band pass filter circuit 43, and an open phase detection unit 44B. The open phase detection unit 44B has the same configuration as that of the open phase detection device 40, except that the fast Fourier transform section 406 and the extraction section 408 are not provided in the open phase detection device 40 of the first to third embodiments.

A pass frequency band of the band pass filter circuit 43 includes a frequency that is twice as high as the frequency of the AC power supply 1. For example, the center frequency of the pass frequency band of the band pass filter circuit 43 coincides with the frequency that is twice as high as the frequency of the AC power supply 1. The band pass filter circuit 43 allows a component (double power supply frequency component) having a frequency corresponding to the pass frequency band among voltage detection values output from the voltage detector 42 to pass therethrough and supplies the double power supply frequency component to the acquisition section 404. The acquisition section 404 acquires the double power supply frequency component and stores the double power supply frequency component in the storage section 420 as a voltage detection value. The determination section 410 reads a predetermined number of voltage detection values from the storage section 420 and determines whether an average value of the predetermined number of voltage detection values is larger than the threshold voltage $V_{TH}$. When the average value of the predetermined number of voltage detection values is larger than the threshold voltage $V_{TH}$, the determination section 410 outputs the open phase detection signal to the control unit 55. Note that the setting of the threshold voltage $V_{TH}$ is as described above.

According to the open phase detection device 40B of the second modified example, the band pass filter circuit 43 extracts the double power supply frequency component. In this way, even though the fast Fourier transform section 406 and the extraction section 408 are not provided, it is possible to extract a component in a desired pass frequency band and to detect an open phase.

Third Modified Example Common to Embodiment

In the first to third embodiments, the open phase detection unit 44 outputs the open phase detection signal to the control unit 55 in the open phase determination process, and the control unit 55 changes the control state of PWM control based on the open phase detection signal. In the third modified example of the first to third embodiments, in addition to or instead of the configurations of the first to third embodiments, the open phase detection unit 44 may transmit the open phase detection signal to a high-level device (not illustrated). Furthermore, the open phase detection unit 44 may output the open phase detection signal from a display device or a speaker as an image, voice and the like, thereby notifying a worker of the occurrence of an open phase.

According to at least one embodiment described above, the power conversion device includes the rectifier, the capacitor, the voltage detection unit, and the open phase detection unit. The rectifier full-wave rectifies alternating current of a plurality of phases supplied from a power supply side. The capacitor smoothes an output voltage of the rectifier. The voltage detection unit detects the smoothed voltage. The open phase detection unit detects that an open phase has occurred in the alternating current of the plurality of phases based on a component of a frequency that is twice as high as a fundamental frequency of the alternating current of the plurality of phases included in frequency components of the smoothed voltage.

While certain embodiments of the invention have been described, these embodiments have been presented by way of examples only and are not intended to limit the scope of the invention. These embodiments can be embodied in a variety of other forms; furthermore, various omissions, substitutions, and changes can be made without departing from the spirit of the present invention. These embodiments and modifications thereof are included in the scope and gist of the invention, and are also included in the invention described in the claims and equivalents thereof.

In the embodiments described above, the examples of the 6-pulse and 36-pulse diode converters have been described; however, the present invention is not limited thereto. The present invention can also be applied to diode converters of 12 pulses, 24 pulses and the like.

In the embodiments described above, the output frequency of the inverse conversion device group 50A is fixed to a predetermined value; however, the output frequency of the inverse conversion device group 50A may be changed in real time to accelerate or decelerate the electric motor 3. In such a case, a process such as adding and discarding a flag may be performed such that an inter-terminal voltage at the timing, at which the fundamental frequency of the AC power supply 1 and the output frequency of the inverse conversion device group 50A substantially coincide with each other, is not employed in the open phase determination process by the open phase detection device 40. In this way, even when the timing, at which the fundamental frequency of the AC power supply 1 and the output frequency of the inverse conversion device group 50A substantially coincide with each other, occurs by changing the output frequency of the inverse conversion device group 50A to accelerate or decelerate the electric motor 3, it is possible to exclude the inter-terminal voltage at such a timing from the open phase determination process by the open phase detection device 40.

REFERENCE SIGNS LIST

1 AC power supply
2, 2A, 2B Power conversion system
3 Electric motor
20, 20U, 20V, 20W Transformer
30, 31U, 31V, 31W Forward conversion device
32 Rectifier
35, 35UP, 35UN, 35VP, 35VN, 35WP, 35WN Capacitor
40, 40UP, 40UN, 40VP, 40VN, 40WP, 40WN Open phase detection device
42 Voltage detector
43 Band pass filter circuit
44, 44A, 44B Open phase detection unit

The invention claimed is:
1. A power conversion device comprising:
a rectifier that full-wave rectifies alternating current of a plurality of phases supplied from a power supply side;
a capacitor that smoothes an output voltage of the rectifier;
a voltage detection unit that detects the smoothed voltage; and
an open phase detection unit that detects that an open phase has occurred in the alternating current of the plurality of phases based on a component having a frequency that is twice as high as a fundamental frequency of the alternating current of the plurality of phases included in frequency components of the smoothed voltage,
wherein the open phase detection unit derives a frequency spectrum of the smoothed voltage by FFT processing, and
when the voltage of the component having the frequency, which is twice as high as the fundamental frequency of the alternating current of the plurality of phases, is larger than a first threshold voltage V and is equal to or less than a second threshold voltage larger than the first threshold voltage in the derived frequency spectrum, the open phase detection unit determines that the open phase has occurred in a phase other than a phase to which the open phase detection unit is connected among the plurality of phases.

2. The power conversion device according to claim 1, wherein, when the component having the frequency, which is twice as high as the fundamental frequency of the alternating current of the plurality of phases, is detected as exceeding a predetermined magnitude among the frequency components of the smoothed voltage, the open phase detection unit detects that the open phase has occurred in the alternating current of the plurality of phases.

3. The power conversion device according to claim 1, wherein the open phase detection unit extracts the component having the frequency that is twice as high as the fundamental frequency from the frequency spectrum.

4. The power conversion device according to claim 1, wherein, when a voltage of the component having the frequency, which is twice as high as the fundamental frequency of the alternating current of the plurality of phases, is larger than a predetermined threshold voltage in the derived frequency spectrum, the open phase detection unit determines that the open phase has occurred in any one of the plurality of phases.

5. The power conversion device according to claim 1, wherein, when the voltage of the component having the frequency, which is twice as high as the fundamental frequency of the alternating current of the plurality of phases, is larger than the second threshold voltage in the derived frequency spectrum, the open phase detection unit determines that the open phase has occurred in the phase to which the open phase detection unit is connected among the plurality of phases.

6. The power conversion device according to claim 1, wherein, in a case where the fundamental frequency of the alternating current of the plurality of phases is substantially equal to a fundamental frequency of alternating current of a plurality of second phases generated by an inverter that receives supply of current rectified by the rectifier and smoothed by the capacitor, when the voltage of the component having the frequency, which is twice as high as the fundamental frequency of the alternating current of the plurality of phases, is larger than a third threshold voltage in the derived frequency spectrum, the open phase detection unit determines that the open phase has occurred in the phase to which the open phase detection unit is connected among the plurality of phases.

7. The power conversion device according to claim 1, wherein the open phase detection unit comprises:
   a band pass filter that extracts a component having a frequency twice as high as the smoothed voltage.

8. The power conversion device according to claim 1, further comprising:
   an inverter that generates AC power to be supplied to a load by using the smoothed voltage,
   wherein a magnitude of the component having the frequency, which is twice as high as the fundamental frequency of the alternating current of the plurality of phases, varies depending on power consumption of the load.

9. The power conversion device according to claim 1, further comprising:
   an inverter that generates AC power to be supplied to a load by using the smoothed voltage,
   wherein, among ripples of the smoothed voltage, a ripple at a timing corresponding to a phase in which an open phase has occurred is larger than a ripple at a timing corresponding to another phase, and a magnitude of the component having the frequency, which is twice as high as the fundamental frequency of the alternating current of the plurality of phases, varies depending on power consumption of the load.

10. The power conversion device according to claim 1, further comprising:
    an inverter that generates AC power to be supplied to a load by using the smoothed voltage,
    wherein a fundamental frequency of the AC power generated by the inverter is different from the fundamental frequency of the alternating current of the plurality of phases.

11. An open phase detection device comprising:
    a voltage detection unit that detects a voltage that is rectified by a rectifier, which full-wave rectifies alternating current of a plurality of phases supplied from a power supply side, and smoothed by a capacitor; and
    an open phase detection unit detects that an open phase has occurred in the alternating current of the plurality of phases based on a component having a frequency that is twice as high as a fundamental frequency of the alternating current of the plurality of phases included in frequency components of the smoothed voltage,
    wherein the open phase detection unit derives a frequency spectrum of the smoothed voltage by FFT processing, and
    when the voltage of the component having the frequency, which is twice as high as the fundamental frequency of the alternating current of the plurality of phases, is larger than a first threshold voltage V and is equal to or less than a second threshold voltage larger than the first threshold voltage in the derived frequency spectrum, the open phase detection unit determines that the open phase has occurred in a phase other than a phase to which the open phase detection unit is connected among the plurality of phases.

* * * * *